(12) United States Patent
Liu et al.

(10) Patent No.: US 11,671,002 B2
(45) Date of Patent: *Jun. 6, 2023

(54) RESONANT SWITCHING POWER CONVERTER

(71) Applicant: Richtek Technology Corporation, Zhubei (TW)

(72) Inventors: Kuo-Chi Liu, Hsinchu (TW); Chung-Lung Pai, Hsinchu (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 145 days.

This patent is subject to a terminal disclaimer.

(21) Appl. No.: 17/244,920

(22) Filed: Apr. 29, 2021

(65) Prior Publication Data

US 2021/0367520 A1 Nov. 25, 2021

Related U.S. Application Data

(60) Provisional application No. 63/027,818, filed on May 20, 2020.

(30) Foreign Application Priority Data

Oct. 5, 2020 (TW) .................................. 109134456

(51) Int. Cl.
*H02M 1/00* (2006.01)
*H02M 3/07* (2006.01)
(Continued)

(52) U.S. Cl.
CPC .......... *H02M 1/0095* (2021.05); *H02M 3/01* (2021.05); *H02M 3/07* (2013.01); *H02M 3/158* (2013.01); *G01R 19/175* (2013.01)

(58) Field of Classification Search
CPC ........ H02M 3/07; H02M 3/073; H02M 3/072; H02M 3/077; H02M 1/0058; H02M 1/0095; H02M 3/158; H02M 3/01
See application file for complete search history.

(56) References Cited

U.S. PATENT DOCUMENTS 9,793,799 B1 * 10/2017 Babazadeh ........... H02M 3/158
9,831,776 B1 11/2017 Jiang et al.
(Continued)

*Primary Examiner* — Gustavo A Rosario-Benitez
(74) *Attorney, Agent, or Firm* — Tung & Associates

(57) ABSTRACT

A resonant switching power converter includes: plural capacitors; plural switches; at least one charging inductor; at least one discharging inductor; a controller which generates a charging operation signal and at least one discharging operation signal; and at least one zero current detection circuit which detects a charging resonant current flowing through the charging inductor in a charging process and/or detect a discharging resonant current flowing through the discharging inductor in a discharging process. When detecting that a level of the charging resonant current or a level of the discharging resonant current is zero, the zero current detection circuit generates at least one zero current detection signal which is sent to the controller. The controller determines start time points and end time points of the charging process and the discharging process according to the zero current detection signal. There can be plural discharging processes.

22 Claims, 13 Drawing Sheets

(51) Int. Cl.
  *H02M 3/158*  (2006.01)
  *H02M 3/00*  (2006.01)
  *G01R 19/175*  (2006.01)

(56) References Cited

U.S. PATENT DOCUMENTS

| | | | |
|---|---|---|---|
| 9,917,517 B1* | 3/2018 | Jiang | H02M 1/34 |
| 10,680,512 B2* | 6/2020 | Babazadeh | H02M 1/36 |
| 2007/0018618 A1 | 1/2007 | Endo | |
| 2011/0175591 A1* | 7/2011 | Cuk | H02M 3/158 |
| | | | 323/311 |
| 2013/0121033 A1* | 5/2013 | Lehn | H02M 3/33569 |
| | | | 363/16 |
| 2018/0367033 A1* | 12/2018 | Kotikalapoodi | H02M 1/14 |
| 2019/0052165 A1* | 2/2019 | Zambetti | H02M 3/005 |
| 2020/0186028 A1* | 6/2020 | Cheng | H02M 3/07 |
| 2020/0186039 A1* | 6/2020 | Cheng | H02M 1/083 |
| 2021/0399621 A1* | 12/2021 | Liu | H02M 3/072 |

\* cited by examiner

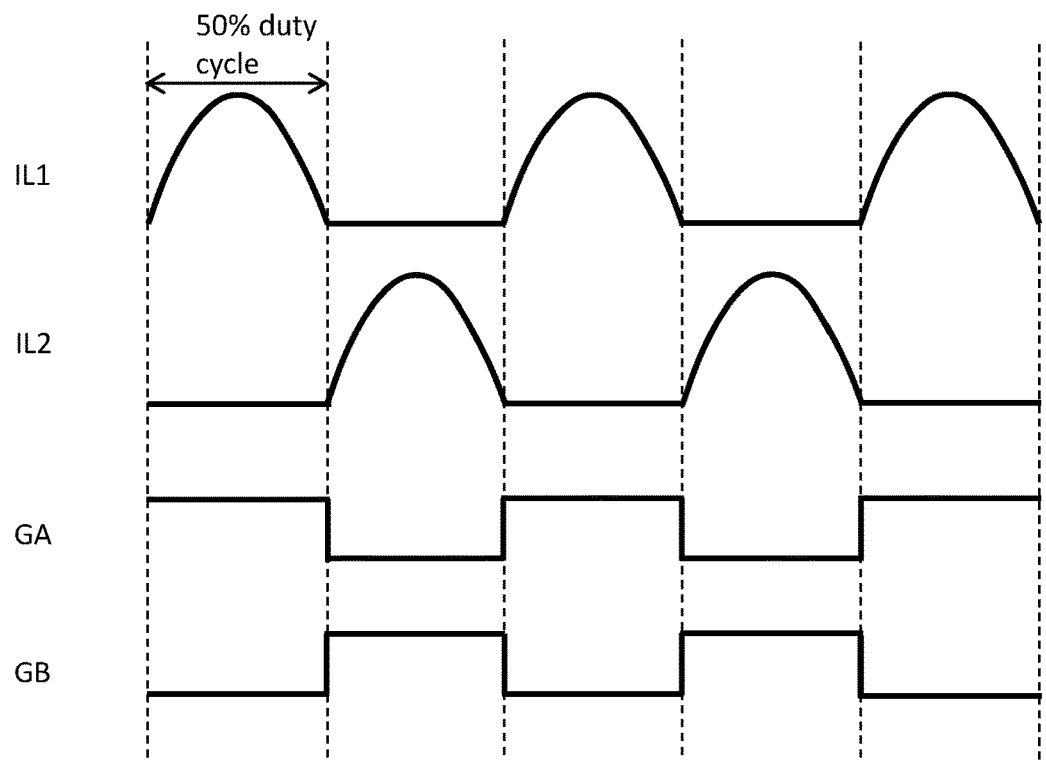
Fig. 11A
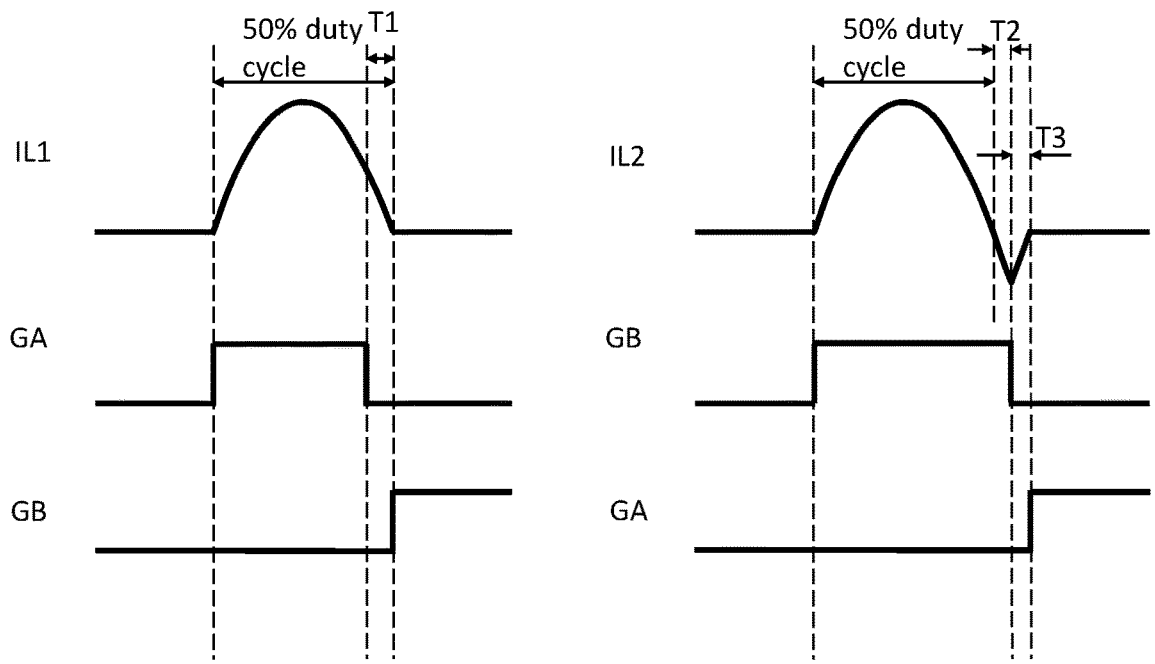
Fig. 11B
Fig. 11C

RESONANT SWITCHING POWER CONVERTER

CROSS REFERENCE

The present invention claims priority to U.S. 63/027,818 filed on May 20, 2020 and claims priority to TW 109134456 filed on Oct. 5, 2020.

BACKGROUND OF THE INVENTION

Field of Invention

The present invention relates to a resonant switching power converter, and particularly to a resonant switching power converter which determines switching time points by detecting zero current.

Description of Related Art

Please refer to FIG. 1, which shows a schematic diagram of a conventional power converter. Under a charging operation, switches Q1, Q3, Q5, Q8 and Q9 are ON, whereas, switches Q2, Q4, Q6, Q7 and Q10 are OFF, so that a series connection of a capacitor C1 and an inductor L1 is formed between an input voltage VIN and an output voltage VOUT and a series connection of a capacitor C2, a capacitor C3 and an inductor L2 is formed between a ground voltage level and the output voltage VOUT. On the other hand, under a discharging operation, switches Q2, Q4, Q6, Q7 and Q10 are ON, whereas, switches Q1, Q3, Q5, Q8 and Q9 are OFF, so that a series connection of the inductor L1, the capacitor C1 and the capacitor C2 is formed between the ground voltage level and the output voltage VOUT and a series connection of the inductor L2 and the capacitor C3 is formed between the ground voltage level and the output voltage VOUT. It is required for the capacitors of this conventional power converter to withstand a relatively higher rated voltage. For example, the DC bias voltage of the capacitor C1 is three times the level of the output voltage VOUT (i.e., Vc1=3VOUT); the DC bias voltage of the capacitor C2 is two times the level of the output voltage VOUT (i.e., Vc2=2VOUT); the DC bias voltage of the capacitor C3 is equal to the level of the output voltage VOUT (i.e., Vc3=VOUT). Because the required DC bias voltage levels of the capacitors are relatively higher, it is required for this conventional power converter to utilize capacitors having a larger size. Additionally, the capacitance of a capacitor usually decreases as its DC bias voltage increases. In a case where a level of the input voltage VIN ranges between 36V and 76V, the DC bias voltage level of the capacitor C1 will range between 27V and 57V. The wide variation range of the DC bias voltage level leads to the wide variation range of the capacitance of the capacitor; as a result, the resonant frequency of this conventional power converter will vary greatly, resulting in a larger switching power loss, and a complicated control mechanism is required for better power conversion efficiency, but still within its constraints. Moreover, the voltage conversion ratio of the input voltage to the output voltage of this conventional power converter is limited to be 4:1 or 2:1; that is, this conventional power converter cannot perform voltage conversion of other voltage conversion ratios, such as 3:1. FIG. 2 illustrates an example in which the capacitance of the capacitor changes as the level of DC bias voltage of the capacitor changes. When the level of DC bias voltage for the capacitor is increased to 50V, the capacitance of the capacitor is decreased by 70%.

In view of the above, to overcome the drawbacks in the prior art, the present invention proposes an innovated power converter.

SUMMARY OF THE INVENTION

In one aspect, the present invention provides a resonant switching power converter for converting an input voltage to an output voltage, the resonant switching power converter including: a plurality of capacitors; a plurality of switches coupled to the plurality of capacitors; at least one charging inductor connected in series to at least one of the plurality of capacitors; at least one discharging inductor connected in series to at least one of the plurality of capacitors; a controller configured to operably generate a charging operation signal corresponding to a charging process and at least one discharging operation signal corresponding to at least one discharging process, so as to operate the plurality of switches, such that the plurality of switches switch electrical connections of the capacitors; and at least one zero current detection circuit configured to operably detect a charging resonant current flowing through the at least one charging inductor in a charging process and/or detect at least one discharging resonant current flowing through the at least one discharging inductor in the at least one discharging process, the zero current detection circuit generating at least one zero current detection signal which is sent to the controller when the zero current detection circuit detects that a level of the charging resonant current and/or a level of the at least one discharging resonant current is zero; wherein the charging operation signal and the at least one discharging operation signal have respective ON periods which do not overlap with one another, such that the charging process and the at least one discharging process do not overlap with one another; wherein in the charging process, the controller is configured to operably control the corresponding switches via the charging operation signal, such that a series connection of the plurality of capacitors and the at least one charging inductor is formed between the input voltage and the output voltage, to form a charging path; wherein in the at least one discharging process, the controller is configured to operably control the corresponding switches via the at least one discharging operation signal, such that a series connection of each of the capacitors and the corresponding discharging inductor is formed between the output voltage and a ground voltage level, to form a plurality of discharging paths at the same time or in a sequential order; wherein the controller determines start time points and end time points of the charging process and the at least one discharging process according to the at least one zero current detection signal; wherein the charging process and the at least one discharging process are arranged in a repeated, alternating manner, so as to convert the input voltage to the output voltage.

In one embodiment, the controller determines start time points and end time points of the charging process and the at least one discharging process further according to the charging operation signal and/or the at least one discharging operation signal.

In one embodiment, the zero current detection circuit includes: a current sensing circuit, which is configured to operably sense the charging resonant current in the charging processes or sense the discharging resonant current in the at least one discharging process, so as to generate a current sensing signal; and a comparison circuit, which is configured to operably compare the current sensing signal with a reference signal, so as to generate the zero current detection signal.

In one embodiment, the resonant switching power converter further includes: a plurality of switch drivers, each of which is coupled between the controller and the corresponding switch, wherein each of the plural switch drivers is configured to operably control the corresponding switch according to the corresponding charging operation signal or the corresponding discharging operation signal.

In one embodiment, the controller includes: a logic circuit coupled to the at least one zero current detection circuit, wherein the logic circuit is configured to operably generate a charging determination signal and a discharging determination signal according to the at least one zero current detection signal and the charging operation signal and/or the at least one discharging operation signal; and a determination circuit coupled to the logic circuit, wherein the determination circuit is configured to operably generate the charging operation signal and the at least one discharging operation signal according to the charging determination signal and the discharging determination signal, so as to determine the start time points and the end time points of the charging process and the at least one discharging process.

In one embodiment, the controller further includes a delay circuit coupled between the logic circuit and the determination circuit, wherein the delay circuit is configured to operably delay the start time point of the charging process and/or the start time point of the at least one discharging process for a delay interval.

In one embodiment, the charging determination signal is employed to determine the start time point of the charging process and the end time point of the at least one discharging process.

In one embodiment, the logic circuit performs AND logic operation on the at least one zero current detection signal and an invert phase signal of the charging operation signal, so as to generate the charging determination signal.

In one embodiment, the determination circuit includes a first latch circuit, wherein the first latch circuit is configured to operably set the charging operation signal according to the charging determination signal and switch a level of the charging operation signal according to the discharging determination signal, and the first latch circuit is configured to operably generate an invert phase signal of the charging operation signal which is inputted into the logic circuit.

In one embodiment, the discharging determination signal is employed to determine the start time point of the at least one discharging process and the end time point of the charging process.

In one embodiment, the logic circuit performs AND logic operation on the at least one zero current detection signal and an invert phase signal of the at least one discharging operation signal, so as to generate the discharging determination signal.

In one embodiment, the determination circuit includes a second latch circuit, wherein the second latch circuit is configured to operably set the at least one discharging operation signal according to the discharging determination signal and switch a level of the at least one discharging operation signal according to the charging determination signal, and the second latch circuit is configured to operably generate an invert phase signal of the at least one discharging operation signal which is inputted into the logic circuit.

In one embodiment, the at least one charging inductor is one single charging inductor, and the at least one discharging inductor is one single discharging inductor.

In one embodiment, an inductance of the single charging inductor is equal to an inductance of the single discharging inductor.

In one embodiment, the at least one charging inductor and the at least one discharging inductor is one same single inductor.

In one embodiment, the same single inductor is a variable inductor.

In one embodiment, the charging process has a charging resonant frequency, whereas, the at least one discharging process has a discharging resonant frequency, and wherein the charging resonant frequency is identical to the discharging resonant frequency.

In one embodiment, the charging process has a charging resonant frequency, whereas, the at least one discharging process has a discharging resonant frequency, and wherein the charging resonant frequency is different from the discharging resonant frequency.

In one embodiment, a level of the reference signal is adjustable to adjust a duration period of the charging process, such that zero voltage switching is achieved.

In one embodiment, a level of the reference signal is adjustable to adjust a duration period of the at least one discharging process, such that zero voltage switching is achieved.

In one embodiment, the resonant switching power converter is a bidirectional resonant switching power converter.

In one embodiment, a voltage conversion ratio of the input voltage to the output voltage of the resonant switching power converter is 4:1, 3:1 or 2:1.

In one embodiment, the at least one zero current detection signal is generated when the at least one zero current detection circuit detects that the level of the charging resonant current is zero, wherein at an end of a delay interval starting from a time point at which the at least one zero current detection signal is generated, the discharging operation signal is switched to perform the at least one discharging process.

In one embodiment, the at least one zero current detection signal is generated when the at least one zero current detection circuit detects that the level of the discharging resonant current is zero, wherein at an end of a delay interval starting from a time point at which the at least one zero current detection signal is generated, the charging operation signal is switched to perform the charging process.

Advantages of the present invention include: that the present invention can reduce the required inductor number; that the present invention can compensate for component parameter variations due to the DC bias voltage or operating temperature; and that the present invention can reduce the switching frequency to enhance the efficiency at light load condition.

Further advantages of the present invention include: that the present invention can support output voltage regulation function; that the present invention can lower voltage stress; that all resonant capacitors can have the same rated current and rated voltage so that the present invention can support using capacitors with a smaller size.

Still other advantages of the present invention include: that the present invention can perform dynamic control to achieve soft-switching with ZCS or ZVS, and that the present invention has better dynamic load transient response and better current voltage balance.

Yet other advantages of the present invention include: that the present invention has stable resonant frequency; that the present invention can flexibly adjust the voltage conversion ratio; that the present invention can perform bidirectional operation.

The objectives, technical details, features, and effects of the present invention will be better understood with regard to the detailed description of the embodiments below, with reference to the attached drawings.

BRIEF DESCRIPTION OF THE DRAWINGS

FIGS. 11A-11C illustrate waveform diagrams of operation signals and inductor currents corresponding to a charging process and a discharging process according to one embodiment of the present invention.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
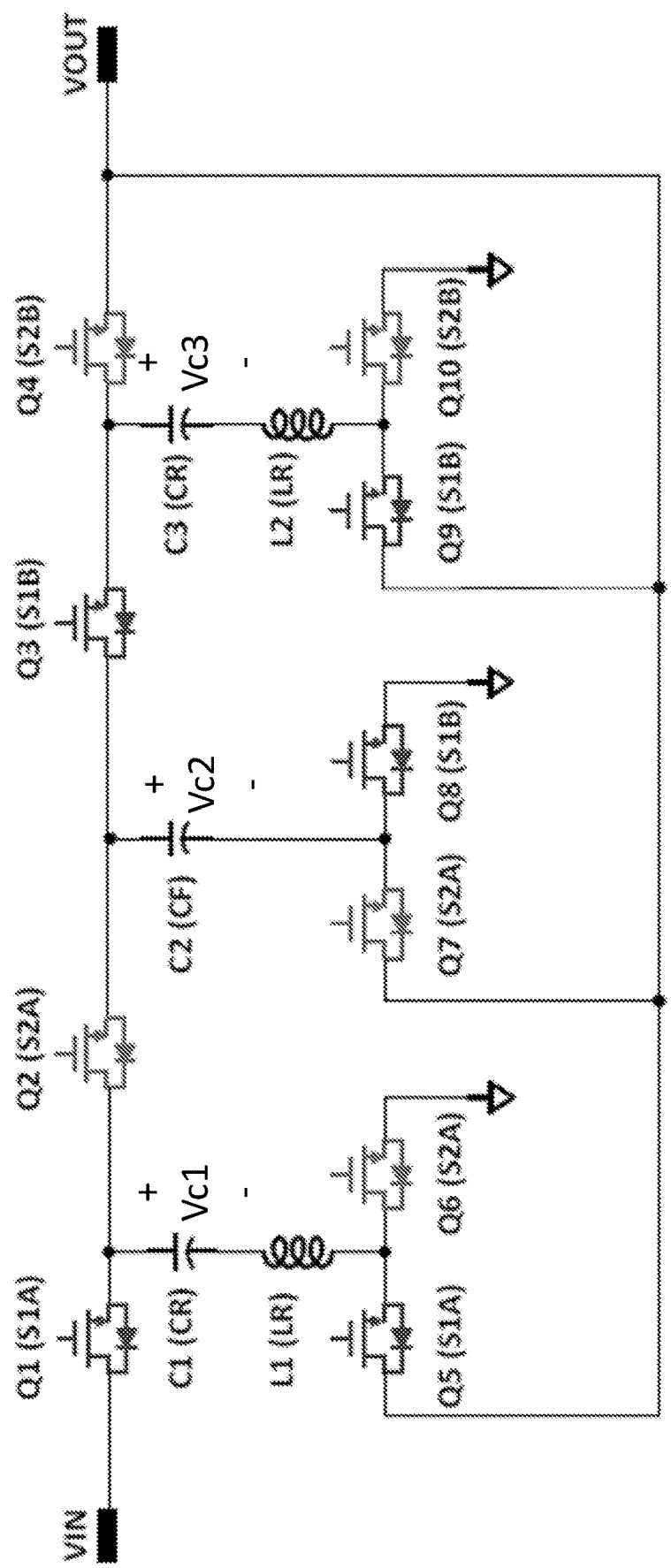
FIG. 1 illustrates a schematic diagram of a conventional power converter.
Figure 2:
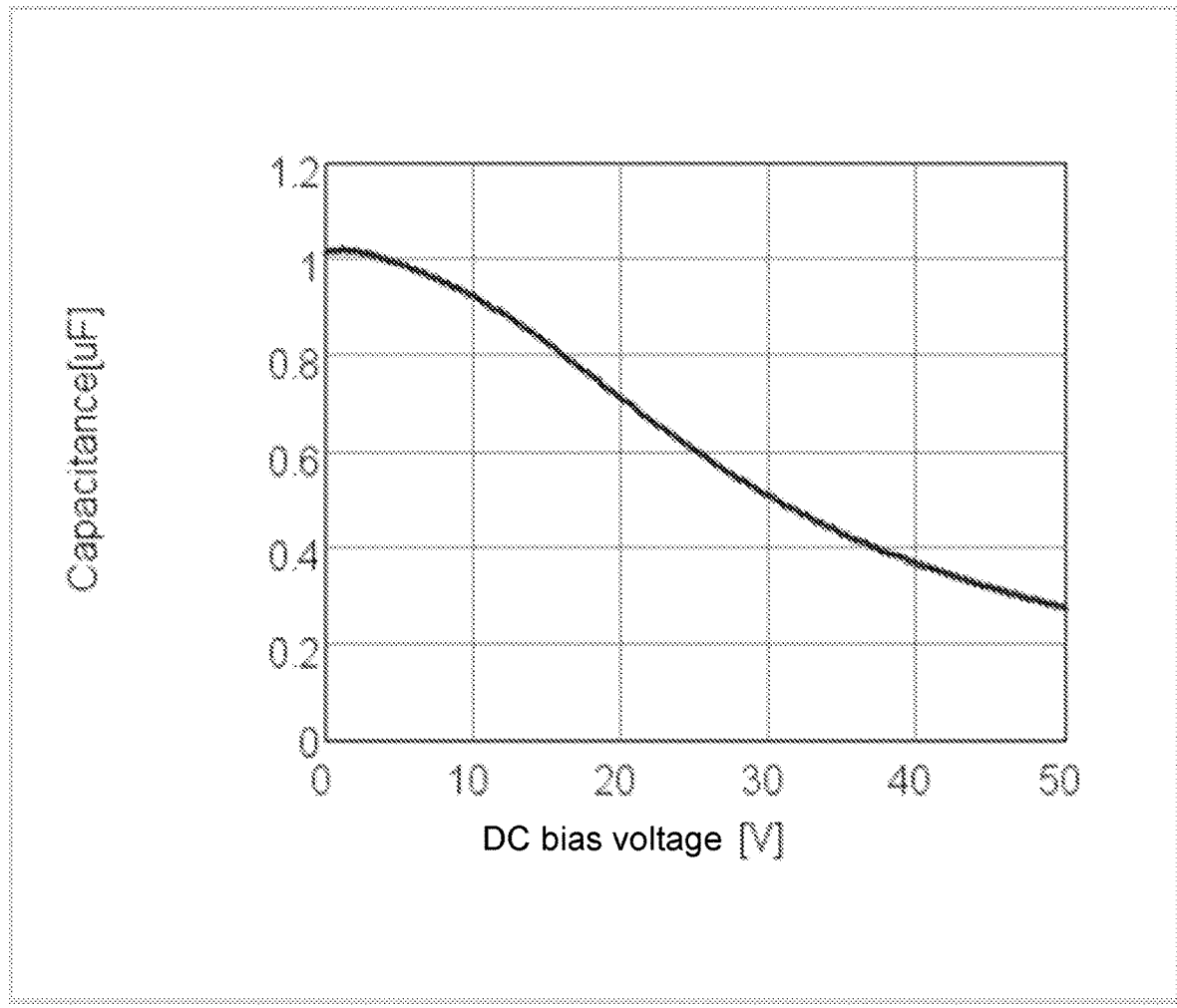
FIG. 2 illustrates a schematic diagram showing that the capacitance of a capacitor changes as its DC bias voltage changes.
Figure 3A:
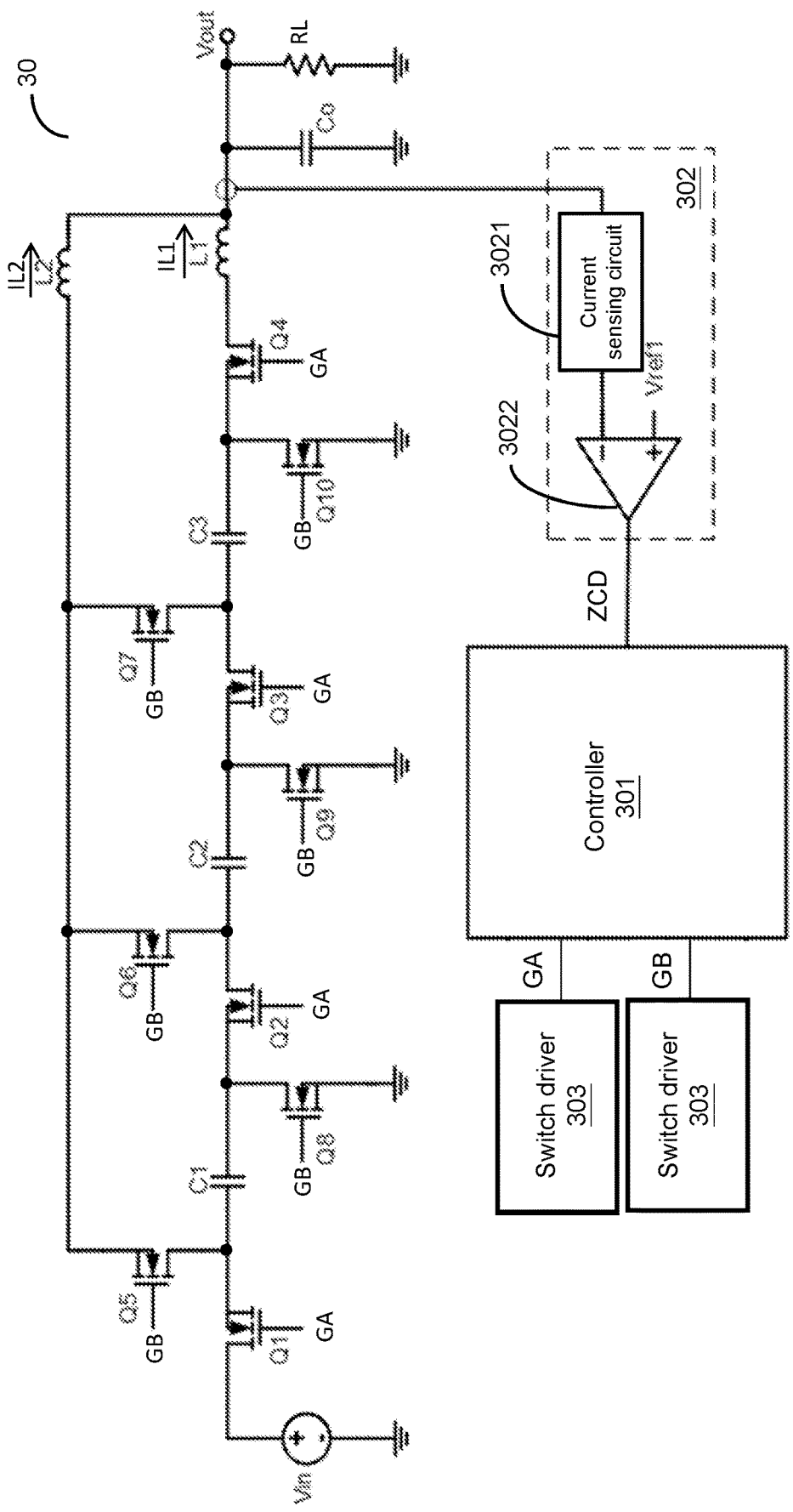
FIG. 3A illustrates a schematic circuit diagram of a resonant switching power converter according to one embodiment of the present invention.

Please refer to FIG. 3A, which shows a schematic circuit diagram of a resonant switching power converter 30 according to one embodiment of the present invention. This embodiment includes several capacitors which share one charging inductor and/or one discharging inductor. Thus, although there are plural capacitors, regardless how many the capacitors may be, only one charging inductor and only one discharging inductor are required so that the required number of inductors is reduced. As shown in FIG. 3A, the resonant switching power converter 30 of the present invention includes: capacitors C1, C2 and C3, switches Q1, Q2, Q3, Q4, Q5, Q6, Q7, Q8, Q9 and Q10, a charging inductor L1, a discharging inductor L2, a controller 301, at least one zero current detection circuit 302 and switch drivers 303. The switches Q1, Q2 and Q3 are connected in series to the corresponding capacitors C1, C2 and C3, respectively. The switch Q4 is connected in series to the charging inductor L1. Certainly, it should be understood that the implementation of the number of the capacitors of the resonant switching power converter 30 as three in the above-mentioned preferred embodiment is only an illustrative example, but not for limiting the broadest scope of the present invention. In other embodiments, it is also practicable and within the scope of the present invention that the number of the capacitors of the resonant switching power converter 30 can be any plural number other than three. It should be understood that the number of the devices in the above-mentioned preferred embodiment is only an illustrative example, but not for limiting the broadest scope of the present invention.

As shown in FIG. 3A, one end of the switch Q5 is coupled to a node between the switch Q1 and the capacitor C1. One end of the switch Q6 is coupled to a node between the switch Q2 and the capacitor C2. One end of the switch Q7 is coupled to a node between the switch Q3 and the capacitor C3. One end of the switch Q8 is coupled to a node between the switch Q2 and the capacitor C1. One end of the switch Q9 is coupled to a node between the switch Q3 and the capacitor C2. One end of the switch Q10 is coupled to a node between the switch Q4 and the capacitor C3. As shown in FIG. 3A, the other ends of the switches Q5-Q7 are commonly electrically connected to a node which is connected to the discharging inductor L2. The other ends of the switches Q8-Q10 are commonly coupled to the ground voltage level. The other ends of the charging inductor L1 and the discharging inductor L2 are commonly coupled to the output voltage Vout. The other end of the switch Q1 is coupled to input voltage Vin. The controller 201 is configured to operably generate a charging operation signal GA corresponding to a charging process and a discharging operation signal GB corresponding to a discharging process, to operate the switches Q1-Q10, such that the switches Q1-Q10 respectively switch electrical connections of the corresponding capacitors C1-C3. The zero current detection circuit 302 is coupled between the controller 301 and the output voltage Vout. The zero current detection circuit 302 is configured to operably detect a charging resonant current IL1 flowing through a node between the charging inductor L1 and the output voltage Vout in the charging process or detect a discharging resonant current IL2 flowing through a node between the discharging inductor L2 and the output voltage Vout in the discharging processes; when the zero current detection circuit 302 detects that the level of the charging resonant current IL1 or the level of the discharging resonant current IL2 is zero, the zero current detection circuit 302 generates zero current detection signal ZCD which is inputted into the controller 301, in order for the controller 301 to generate the charging operation signal GA and the discharging operation signal GB. (In the context of this invention, a switch is regarded as a two-end device and its control terminal is regarded as a control input, not an "end".)

In one embodiment, the controller 301 can determine start time points and end time points of the charging process and the discharging process according to the zero current detection signal ZCD, and the corresponding charging operation signal GA or the corresponding discharging operation signal GB. In this embodiment, the zero current detection circuit 302 includes a current sensing circuit 3021, which is configured to operably sense the charging resonant current IL1 in the charging processes or sense the discharging resonant current IL2 in the discharging processes. The zero current detection circuit 302 further includes a comparison circuit 3022, which is configured to operably compare the sensed charging resonant current IL1 or discharging resonant current IL2 with a reference signal Vrefl, so as to generate the zero current detection signal ZCD. The switch drivers 303 are respectively coupled between the controller 301 and the corresponding switches Q1-Q10 controlled by the switch drivers 303. The switch drivers 303 are configured to operably control the corresponding switches Q1-Q10 according to the charging operation signal GA or the discharging operation signal GB. In this embodiment and other embodiments, the zero current detection signal ZCD is generated when the zero current detection circuit 302 detects that the level of the charging resonant current IL1 is zero. After the time point at which the zero current detection signal ZCD is generated, there is a delay interval and the discharging operation signal GB is switched to high level at the end of the delay interval to perform the discharging process. In this embodiment and other embodiments, the zero current detection signal ZCD is also generated when the zero current detection circuit 302 detects that the level of the discharging resonant current IL2 is zero. After the time point at which the zero current detection signal ZCD is generated, there is a delay interval and the charging operation signal GA is switched to high level at the end of the delay interval to perform the charging process.

The switches Q1-Q10 are controlled by the switch drivers 303 to switch electrical connections of the corresponding capacitors C1-C3 with the charging inductor L1 and the discharging inductor L2 according to the charging operation signal GA and the discharging operation signal GB generated by the controller 301. In one embodiment, the ON periods of the charging operation signal GA and the discharging operation signal GB do not overlap with one another.

In the charging process, according to the charging operation signal GA, the switches Q1-Q4 are controlled to be ON, whereas, the switches Q5-Q10 are controlled to be OFF, such that a series connection of the capacitors C1-C3 and the charging inductor L1 is formed between the input voltage Vin and the output voltage Vout, to form a charging path. In the discharging process, according to the discharging operation signal GB, the switches Q5-Q10 are controlled to be ON, whereas, the switches Q1-Q4 are controlled to be OFF, such that the capacitors C1, C2 and C3 are connected in parallel and the parallel connection is connected in series to the discharging inductor L2, to form plural discharging paths.

It should be noted that, in one embodiment, the above-mentioned charging process and the above-mentioned discharging process are performed at different periods in a repeated, alternating manner. That is, the above-mentioned charging process and the above-mentioned discharging process are not performed at the same time; the charging process and the discharging process are performed in turn, to convert the input voltage Vin to the output voltage Vout. In this embodiment, the DC bias voltages of the capacitors C1, C2 and C3 all have a level of Vo. Hence, as compared to the prior art, under the same level of the input voltage and the same level of the output voltage, the capacitors C1, C2 and C3 of the present invention will only need to withstand a relatively lower rated voltage. Hence, the present invention can use capacitors having a smaller size.

In one embodiment, the charging resonant frequency of the above-mentioned charging process is identical to the discharging resonant frequency of the above-mentioned discharging process. In one embodiment, the charging resonant frequency of the above-mentioned charging process is different from the discharging resonant frequency of the above-mentioned discharging process. In one embodiment, the above-mentioned resonant switching power converter 30 may be a bidirectional resonant switching power converter. As one having ordinary skill in the art readily understands, "bidirectional resonant switching power converter" refers to a converter whose input terminal (which is coupled to the input voltage Vin) and an output terminal (which is coupled to the output voltage Vout) are interchangeable. That is, in the embodiment shown in FIG. 3A, the resonant switching power converter 30 can convert the output voltage Vout to the input voltage Vin. In one embodiment, the voltage conversion ratio of the input voltage Vin to the output voltage Vout of the above-mentioned resonant switching power converter 30 can be 4:1, 3:1 or 2:1.

In one embodiment, the duration period (Ton1) of the above-mentioned charging process is correlated with the charging resonant frequency (fr1) of the above-mentioned charging process. In one preferred embodiment, the duration period (Ton1) of the above-mentioned charging process is correlated with a positive half wave of a charging resonant current of the charging process. For example, the turned-ON time points and turned-OFF time points of the switches Q1-Q4 are substantially synchronous with a start time point and an end time point of the positive half wave of the charging resonant current of the charging process, respectively. In one embodiment, the duration period (Ton2) of the above-mentioned discharging process is correlated with the discharging resonant frequency (fr2) of the above-mentioned discharging process. In one preferred embodiment, the duration period (Ton2) of the above-mentioned discharging process is correlated with a positive half wave of a discharging resonant current of the discharging process. For example, the turned-ON time points and turned-OFF time points of the switches Q5-Q10 are substantially synchronous with a start time point and an end time point of the positive half wave of the discharging resonant current of the discharging process, respectively.

In the embodiment where the charging resonant frequency (fr1) of the above-mentioned charging process is equal to the discharging resonant frequency (fr2) of the above-mentioned discharging process, when the duration period (Ton1) of the above-mentioned charging process is equal to the duration period (Ton2) of the above-mentioned discharging process (e.g., when the duration period (Ton1) of the above-mentioned charging process is substantially equal to 50% of the cycle period), the switches can be switched at a time point when the currents flowing through the switches are at a relatively lower level of their respective positive half waves, such that soft switching can be achieved. In one preferred embodiment, zero current switching (ZCS) can be achieved.

Note that although it is preferred for the duration period of the charging process to be equal to the duration period of the discharging process (i.e., the duration period of the charging process is equal to 50% of the cycle period), to achieve exact zero current switching, however due to non-idealities caused by for example imperfection of components or imperfect matching among components, the duration period of the charging process may not be equal to exactly 50% of the cycle period, but just close to 50% of the cycle period. In other words, according to the present invention, a certain level of error between the duration period of the charging process and 50% of the cycle period is acceptable, and therefore the term "substantially" is used to mean that an insignificant error within a tolerable range is acceptable. The terms "substantially" used hereinafter in this specification also mean that an insignificant error within a tolerable range is acceptable.

In one embodiment, the duration period of the above-mentioned charging process is smaller than a specific ratio of cycle period by a predetermined period. For example, the duration period of the above-mentioned charging process is smaller than 50% of the cycle period by a predetermined period. Thus, after the first switches Q1-Q4 have been turned OFF, a little amount of current remains, which flows through the charging inductor L1 to take away accumulated charges stored in a parasitic capacitor of the switch Q10 via the parasitic diode of the first switch Q4, so that the voltage across the first switch Q10 can be reduced, thus achieving soft switching. In one preferred embodiment, the predetermined period can be adjusted by adjusting the level of the reference signal, to achieve zero voltage switching (ZVS).

In one embodiment, the duration period of the above-mentioned discharging process is greater than a specific ratio of cycle period by a predetermined period. For example, the duration period of the above-mentioned discharging process is greater than 50% of the cycle period by a predetermined period. Thus, during the delayed turned-OFF period of the first switches Q5-Q10, a negative current of the discharging inductor L2 will flow through a parasitic diode of the first switch Q5, to charge a parasitic capacitor of the first switch Q1. As a result, the voltage across the first switch Q1 will be reduced, for achieving soft switching. In one preferred embodiment, the predetermined period can be adjusted by adjusting the level of the reference signal, to achieve zero voltage switching (ZVS).

Figure 3B:
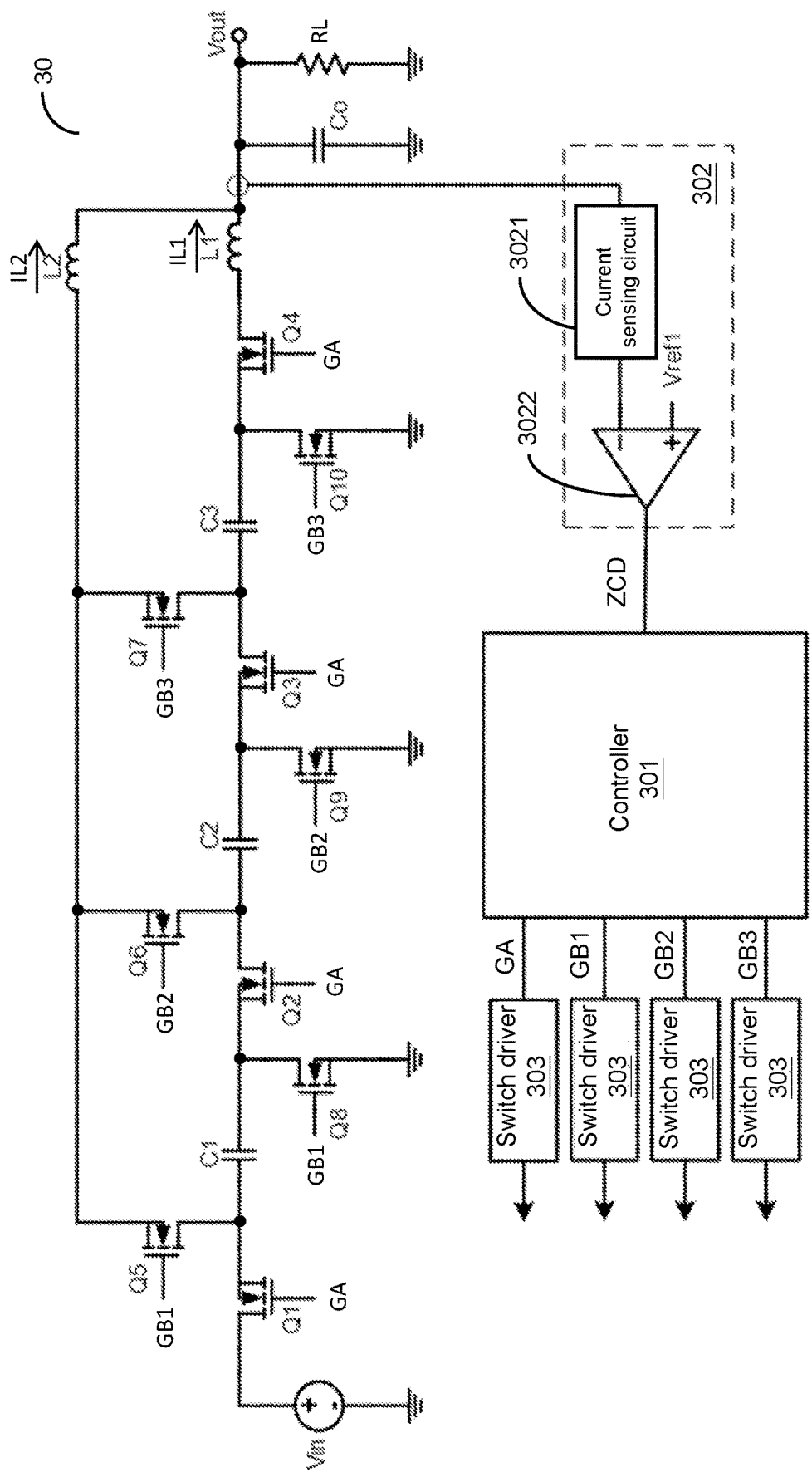
FIG. 3B illustrates a schematic circuit diagram of a resonant switching power converter according to one embodiment of the present invention.

FIG. 3B illustrates a schematic circuit diagram of a resonant switching power converter according to one embodiment of the present invention. The difference between this embodiment and the embodiment shown in FIG. 3A is that there are plural discharging processes in this embodiment. The controller 301 is configured to operably generate a charging operation signal GA corresponding to a charging process and plural discharging operation signals GB1, GB2 and GB3 corresponding to three discharging processes, to thereby operate the switches Q1-Q10, such that the switches Q1-Q10 switch the electrical connections of the corresponding capacitors C1-C3 accordingly. A zero current detection circuit 302 is coupled between the controller 301 and the output voltage Vout. The zero current detection circuit 302 is configured to operably detect a charging resonant current IL1 flowing through a node between the charging inductor L1 and the output voltage Vout in the charging process or detect a discharging resonant current IL2 flowing through a node between the discharging inductor L2 and the output voltage Vout in each of the discharging processes. When the zero current detection circuit 302 detects that the level of the charging resonant current IL1 is zero or the level of the discharging resonant current IL2 is zero, the zero current detection circuit 302 will generate a zero current detection signal ZCD, which is inputted into the controller 301, for the controller 301 to generate the charging operation signal GA and the discharging operation signals GB1, GB2 and GB3 accordingly.

In one embodiment, the controller 301 can determine start time points and end time points of the charging process and the discharging processes according to the zero current detection signal ZCD and the corresponding charging operation signal GA or the corresponding discharging operation signals GB1, GB2 and GB3. In this embodiment, the zero current detection circuit 302 includes a current sensing circuit 3021, which is configured to operably sense the charging resonant current IL1 in the charging process or sense the discharging resonant current IL2 in the discharging processes. The zero current detection circuit 302 further includes a comparison circuit 3022, which is configured to operably compare the sensed charging resonant current IL1 or discharging resonant current IL2 with a reference signal Vrefl, so as to generate the zero current detection signal ZCD. The switch drivers 303 are respectively coupled between the controller 301 and the corresponding switches Q1-Q10 controlled by the switch drivers 303. The switch drivers 303 are configured to operably control the corresponding switches Q1-Q10 according to the charging operation signal GA or the signals GB1, GB2 and GB3.

The switches Q1-Q10 are controlled by the corresponding switch drivers 303 to switch electrical connections of the corresponding capacitors C1-C3 with the charging inductor L1 and the discharging inductor L2 according to the charging operation signal GA and the discharging operation signals GB1, GB2 and GB3 generated by the controller 301. In one embodiment, the ON periods of the charging operation signal GA and the discharging operation signals GB1, GB2 and GB3 do not overlap with one another.

For example, In the charging process, according to the charging operation signal GA, the switches Q1-Q4 are controlled to be ON, whereas, the switches Q5-Q10 are controlled to be OFF, such that a series connection of the capacitors C1-C3 and the charging inductor L1 is formed between the input voltage Vin and the output voltage Vout, to form a charging path. In a first discharging process, according to the discharging operation signal GB1, the switches Q5 and Q8 are controlled to be ON, whereas, the switches Q1-Q4, Q6, Q7, Q9 and Q10 are controlled to be OFF, such that the capacitor C1 is connected in series to the discharging inductor L2, to form a first discharging path. In a second discharging process, according to the discharging operation signal GB2, the switches Q6 and Q9 are controlled to be ON, whereas, the switches Q1-Q4, Q5, Q7, Q8 and Q10 are controlled to be OFF, such that the capacitor C2 is connected in series to the discharging inductor L2, to form a second discharging path. In a third discharging process, according to the discharging operation signal GB3, the switches Q7 and Q10 are controlled to be ON, whereas, the switches Q1-Q4, Q5, Q6, Q8 and Q9 are controlled to be OFF, such that the capacitor C3 is connected in series to the discharging inductor L2, to form a third discharging path.

It should be noted that, in one embodiment, the above-mentioned charging process and the above-mentioned first discharging process, second discharging process and third discharging process are performed at different periods in a repeated, alternating manner. That is, the above-mentioned charging process and the above-mentioned first discharging process, second discharging process and third discharging process are not performed at the same time. In one embodiment, the charging process and the above-mentioned three discharging processes are performed in turn, to convert the input voltage Vin to the output voltage Vout. In other words, after one charging process has completed, the first discharging process, the second discharging process and the third discharging process are then performed in a sequential order. Subsequently, the charging process is performed again, and so on.

Figure 4:
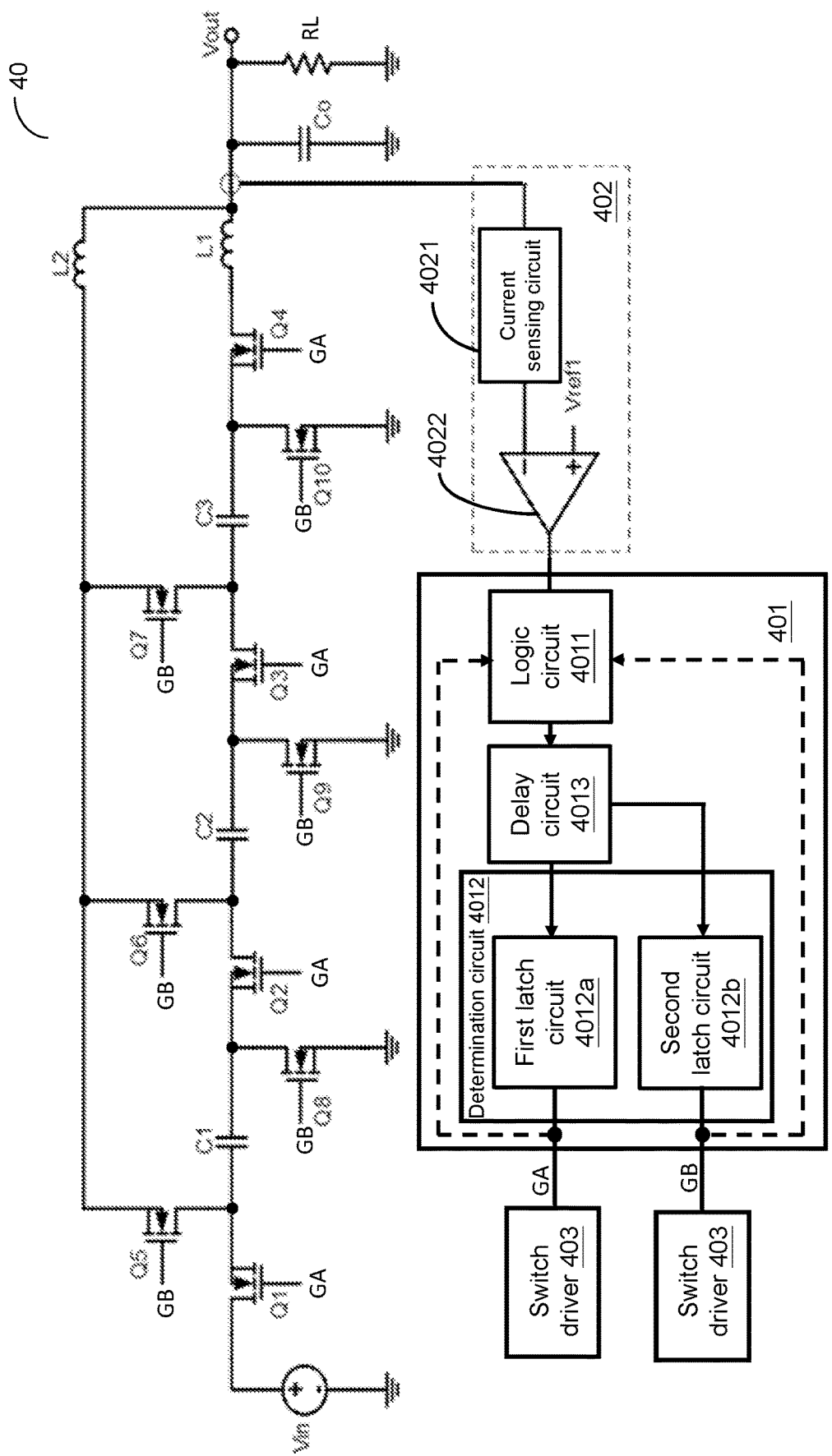
FIG. 4 illustrates a schematic circuit diagram of a resonant switching power converter according to another embodiment of the present invention.

FIG. 4 illustrates a schematic circuit diagram of a resonant switching power converter 40 according to another embodiment of the present invention. The configuration and operation mechanism of capacitors C1-C3, a charging inductor L1, a discharging inductor L2, switches Q1-Q10, zero current detection circuit 402, a current sensing circuit 4021, a comparison circuit 4022 and switch drivers 403 in FIG. 4 are similar to those in FIG. 3A and the detailed description thereof are therefore omitted. The difference between this embodiment and the embodiment shown in FIG. 3A is that the controller 401 of this embodiment includes a logic circuit 4011, a determination circuit 4012 and a delay circuit 4013. The determination circuit 4012 includes a first latch circuit 4012a and a second latch circuit 4012b.

In one embodiment, the delay circuit 4013 is optional. The logic circuit 4011 is coupled to the zero current detection circuit 402, wherein the logic circuit 4011 is configured to operably generate a charging determination signal and a discharging determination signal according to the zero current detection signal and the charging operation signal GA and/or the discharging operation signal GB. In one embodiment, the charging determination signal is employed to determine start time points of the charging process and end time points of the discharging process. The logic circuit 4011 performs, for example but not limited to, AND logic operation on the zero current detection signal and an invert phase signal of the charging operation signal GA, so as to generate the charging determination signal. In one embodiment, the discharging determination signal is utilized to determine start time points of the discharging process and end time points of the charging process. The logic circuit 4011 performs, for example but not limited to, AND logic operation on the zero current detection signal and an invert phase signal of the discharging operation signal GB, so as to generate the discharging determination signal. The determination circuit 4012 is coupled to the logic circuit 4011, wherein the determination circuit 4012 is configured to operably generate the charging operation signal GA and the discharging operation signal GB according to the charging determination signal and the discharging determination signal, so as to determine start time points and end time points of the charging process and the discharging process correspondingly. The delay circuit 4013 is coupled between the logic circuit 4011 and the determination circuit 4012, wherein the delay circuit 4013 is configured to operably delay the start time point of the charging process and/or the start time point of the discharging process for a delay interval, so as to reduce the switching frequency and to adjust the voltage conversion ratio of the input voltage Vin to the output voltage Vout.

For example, in the charging process, the charging operation signal GA is at high level. When the zero current detection signal ZCD from the zero current detection circuit 402 is switched to high level, the logic circuit 4011 generates the discharging determination signal at high level according to the charging operation signal GA at high level and the zero current detection signal ZCD at high level, and outputs the discharging determination signal which is sent to the determination circuit 4012. The determination circuit 4012 then generates the discharging operation signal GB at high level which is sent to the switch drivers 403, such that the switches Q5-Q10 are controlled to be ON. On the other hand, the logic circuit 4011 generates the charging determination signal at low level according to an invert phase signal of the charging operation signal GA at low level in the charging process. The determination circuit 4012 switches the charging operation signal GA to low level according to the discharging determination signal at high level and the charging determination signal at low level, such that the switches Q1-Q4 are controlled to be OFF and the charging process is completed.

On the other hand, in the discharging process, the discharging operation signal GB is at high level. When the zero current detection signal ZCD from the zero current detection circuit 402 is switched to high level, the logic circuit 4011 generates the charging determination signal at high level according to the discharging operation signal GB at high level and the zero current detection signal ZCD at high level, so as to output the charging determination signal which is sent to the determination circuit 4012. The determination circuit 4012 then generates the charging operation signal GA at high level which is sent to the switch drivers 403, such that the switches Q1-Q4 are controlled to be ON. And, the logic circuit 4011 generates the discharging determination signal at low level according to an invert phase signal of the discharging operation signal GB at low level in the discharging process. The determination circuit 4012 switches the discharging operation signal GB to low level according to the charging determination signal at high level and the discharging determination signal at low level, such that the switches Q5-Q10 are controlled to be OFF and the discharging process is completed.

The first latch circuit 4012a is configured to operably set the charging operation signal GA according to the charging determination signal and switch the level of the charging operation signal GA according to the discharging determination signal. The first latch circuit 4012a is further configured to operably generate an invert phase signal of the charging operation signal GA, which is sent to the logic circuit 4011. In one embodiment, when the first latch circuit 4012a receives the charging determination signal at high level, the first latch circuit 4012a will set the charging operation signal GA as high level and generate the invert phase signal of the charging operation signal GA at low level to be inputted into the logic circuit 4011. On the other hand, when the first latch circuit 4012a receives the discharging determination signal at high level, the first latch circuit 4012a will switch the level of the charging operation signal GA to low level and generate the invert phase signal of the charging operation signal at high level to be inputted into the logic circuit 4011.

The second latch circuit 4012b is configured to operably set the discharging operation signal GB according to the discharging determination signal and switch the level of the discharging operation signal GB according to the charging determination signal. The second latch circuit 4012b is further configured to operably generate an invert phase signal of the discharging operation signal GB, which is sent to the logic circuit 4011. In one embodiment, when the second latch circuit 4012b receives the discharging determination signal at high level, the second latch circuit 4012b will set the discharging operation signal GB as high level and generate the invert phase signal of the discharging operation signal GB at low level to be inputted into the logic circuit 4011. On the other hand, when the second latch circuit 4012b receives the charging determination signal at high level, the second latch circuit 4012b will switch the level of the discharging operation signal GB to low level and generate the invert phase signal of the discharging operation signal at high level to be inputted into the logic circuit 4011.

Figure 5:
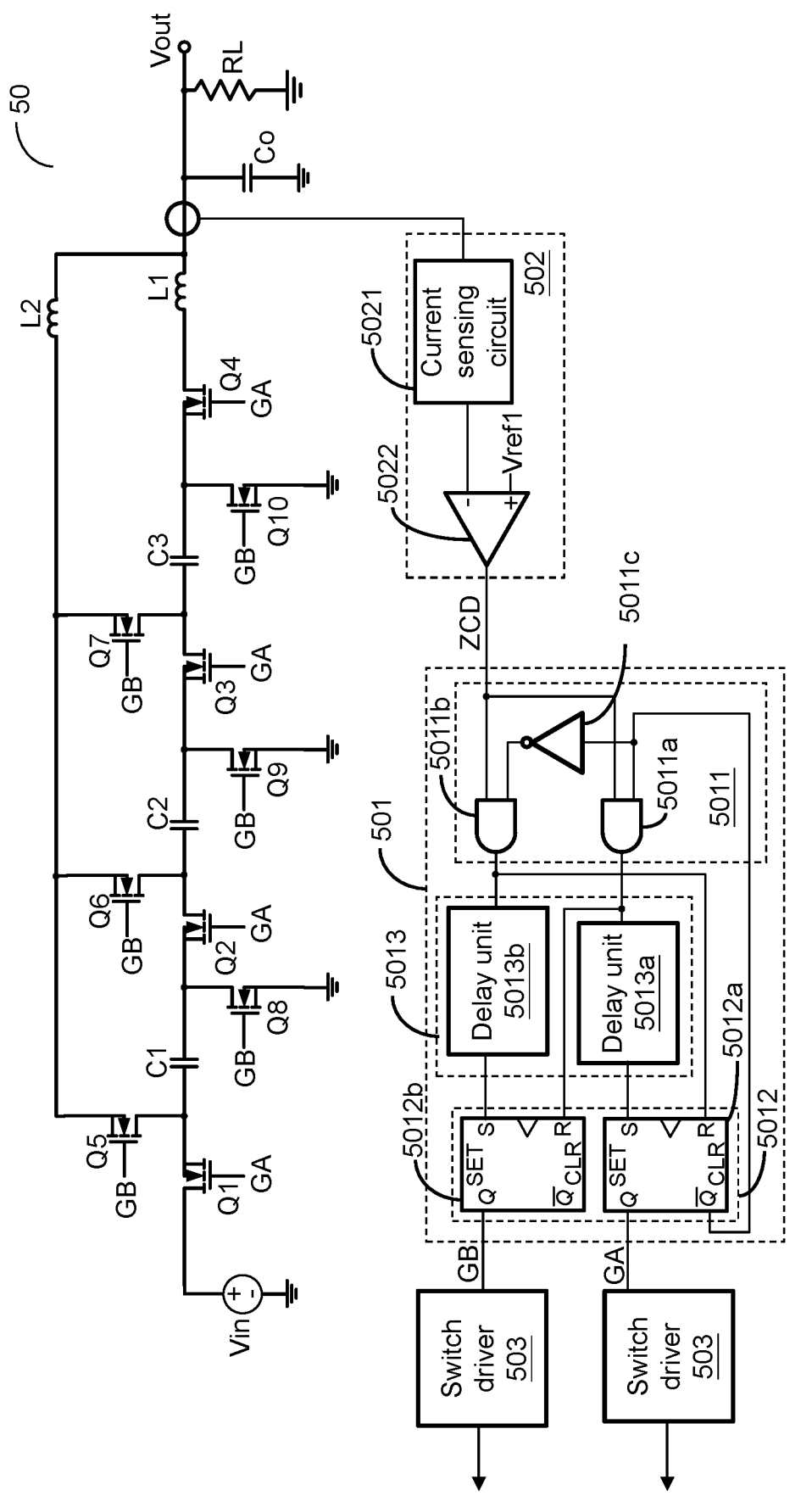
FIG. 5 illustrates a schematic circuit diagram of a resonant switching power converter according to still another embodiment of the present invention.

FIG. 5 illustrates a more specific schematic circuit diagram of a resonant switching power converter 50 according to still another embodiment of the present invention. The configuration and operation mechanism of the capacitors C1-C3, the charging inductor L1, the discharging inductor L2, the switches Q1-Q10, the zero current detection circuit 502, the current sensing circuit 5021, the comparison circuit 5022 and the switch drivers 503 in FIG. 5 are similar to those in FIG. 3A and the detailed description thereof are therefore omitted. The difference between this embodiment and the embodiment shown in FIG. 3A is that the controller 501 of this embodiment includes a logic circuit 5011, a determination circuit 5012 and a delay circuit 5013. In this embodiment, the determination circuit 5012 includes a first latch circuit 5012a and a second latch circuit 5012b. The delay circuit 5013 includes a delay unit 5013a and a delay unit 5013b.

In one embodiment, the delay circuit 5013 may be optional. In this embodiment, the logic circuit 5011 includes a first AND gate 5011a, a second AND gate 5011b and a NOT gate 5011c. The first AND gate 5011a is coupled between the comparison circuit 5022 and the first latch circuit 5012a; the second AND gate 5011b is coupled between the comparison circuit 5022 and the second latch circuit 5012b; the NOT gate 5011c is coupled between the first latch circuit 5012a and the second AND gate 5011b. In the determination circuit 5012, the first latch circuit 5012a is coupled between the first AND gate 5011a and the corresponding switch driver 503, whereas, the second latch circuit 5012b is coupled between the second AND gate 5011b and the corresponding switch driver 503.

One operation method according to the present invention is described as an example with reference to the embodiment shown in FIG. 5. When the charging process starts, a reset terminal R of the second latch circuit 5012b receives the charging determination signal at high level, so as to reset an output terminal Q of the second latch circuit 5012b, such that the output terminal Q of the second latch circuit 5012b outputs the discharging operation signal GB at low level and the switches Q5-Q10 are thus controlled to be OFF. In the charging process, an output terminal Q of the first latch circuit 5012a outputs a charging operation signal GA at high level, so as to control the switches Q1-Q4 to be ON. The NOT gate 5011c performs a NOT logic operation on an invert phase signal (at low level) of the charging operation signal GA outputted by an invert phase output terminal Q of the first latch circuit 5012a, so as to generate a logic operation result at high level which is sent to the second AND gate 5011b. The second AND gate 5011b keeps the discharging determination signal at low level until the zero current detection circuit 502 detects that the charging resonant current IL1 drops to zero current and the zero current detection signal ZCD is switched to high level (which indicates that the charging process is completed). The second AND gate 5011b performs AND logic operation on the logic operation result at high level outputted by the NOT gate 5011c and the zero current detection signal ZCD at high level, so as to generate the discharging determination signal at high level which is sent to the determination circuit 5012. Accordingly, the second latch circuit 5012b generates the discharging operation signal GB at high level at the output terminal Q thereof, which is sent to the switch driver 503, to control the switches Q5-Q10 to be ON and start the discharging process. Besides, the reset terminal R of the first latch circuit 5012a receives the discharging determination signal at high level and resets the output terminal Q of the first latch circuit 5012a, such that the output terminal Q generates the charging operation signal GA at low level, which is sent to the corresponding switch driver 503. The switches Q1-Q4 are thus controlled to be OFF and the charging process is completed.

On the other hand, when the discharging process starts, a reset terminal R of the first latch circuit 5012a receives the discharging determination signal at high level, so as to reset an output terminal Q of the first latch circuit 5012a, such that the output terminal Q of the first latch circuit 5012a outputs the charging operation signal GA at low level and the switches Q1-Q4 are thus controlled to be OFF. In the discharging process, an output terminal Q of the second latch circuit 5012b outputs a discharging operation signal GB at high level, so as to control the switches Q5-Q10 to be ON. An invert phase signal (at high level) of the charging operation signal GA outputted by an invert phase output terminal Q of the first latch circuit 5012a is inputted into the first AND gate 5011a. The first AND gate 5011a keeps the charging determination signal at low level until the zero current detection circuit 502 detects that the discharging resonant current IL2 drops to zero current and the zero current detection signal ZCD is switched to high level (which indicates that the discharging process is completed). The first AND gate 5011a performs AND logic operation on an invert phase signal (at high level) of the charging operation signal GA outputted by the invert phase output terminal Q and the zero current detection signal ZCD at high level, so as to generate the charging determination signal at high level, which is sent to the determination circuit 5012. Accordingly, the first latch circuit 5012a generates the charging operation signal GA at high level at the output terminal Q thereof, which is sent to the switch driver 503, so as to control the switches Q1-Q4 to be ON and start the charging process. Besides, the reset terminal R of the second latch circuit 5012b receives the charging determination signal at high level and resets the output terminal Q of the second latch circuit 5012b, such that the output terminal Q thereof generates the discharging operation signal GB at low level, which is sent to the corresponding switch driver 503. The switches Q5-Q10 are thus controlled to be OFF and the discharging process is completed.

The delay unit 5013a is coupled between the first AND gate 5011a and a set terminal S of the first latch circuit 5012a, wherein the delay unit 5013a is configured to operably delay the turned-ON time points of the plural switches Q1-Q4 for a delay interval, wherein in the delay interval all of the corresponding switches Q1-Q4 are OFF, to delay the start time points of the charging process for a time period which is the delay interval. The delay unit 5013b is coupled between the second AND gate 5011b and a set terminal S of the second latch circuit 5012b, wherein the delay unit 5013b is configured to operably delay the turned-ON time points of the plural switches Q5-Q10 for a delay interval, wherein in the delay interval all of the corresponding switches Q5-Q10 are OFF, so as to delay the start time points of the discharging process for a time period which is the delay interval.

In one embodiment, the inductance of the charging inductor L1 is equal to the inductance of the discharging inductor L2. In one embodiment, which is a specific preferred embodiment, the charging inductor L1 and the discharging inductor L2 can be one same single inductor, which functions as the charging inductor and the discharging inductor at different periods, respectively.

Figure 6:
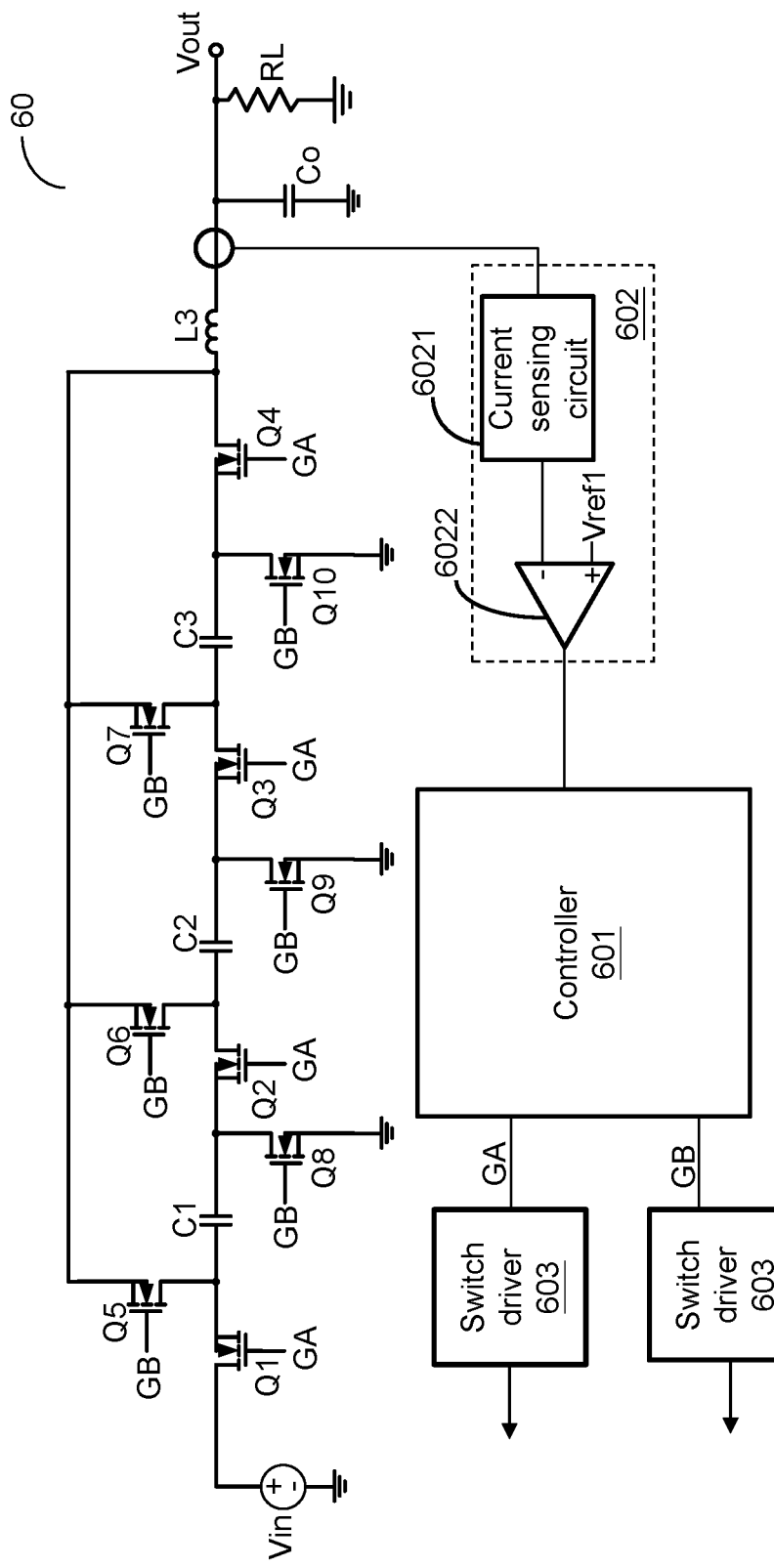
FIG. 6 illustrates a schematic circuit diagram of a resonant switching power converter according to yet another embodiment of the present invention.

Therefore, please refer to FIG. 6. FIG. 6 illustrates a schematic circuit diagram of a resonant switching power converter 60 according to yet another embodiment of the present invention. The configuration and operation mechanism of the controller 601, the zero current detection circuit 602, the current sensing circuit 6021, the comparison circuit 6022 and the switch drivers 603 in FIG. 6 are similar to those in. 3A and the detailed description thereof are therefore omitted. The difference between this embodiment and the embodiment shown in FIG. 3A is that the charging inductor and the discharging inductor of this embodiment is one same inductor L3. Such implementation in this embodiment can reduce the required number of the inductors. As shown in FIG. 6, the resonant switching power converter 60 of the present invention includes: capacitors C1, C2 and C3, switches Q1, Q2, Q3, Q4, Q5, Q6, Q7, Q8, Q9 and Q10, and an inductor L3. The switches Q1, Q2 and Q3 are connected in series to the corresponding capacitors C1, C2 and C3, respectively. The switch Q4 is connected in series to the inductor L3. Certainly, it should be understood that the implementation of the number of the capacitors of the resonant switching power converter 60 as three in the above-mentioned preferred embodiment is only an illustrative example, but not for limiting the broadest scope of the present invention. In other embodiments, it is also practicable and within the scope of the present invention that the number of the capacitors of the resonant switching power converter 60 can be any plural number other than three. It should be understood that the number of the devices in the above-mentioned preferred embodiment, unless emphasized to be a feature, is only an illustrative example, but not for limiting the broadest scope of the present invention.

It is noteworthy that, in this embodiment, the charging inductor and the discharging inductor is one same single inductor L3. In the discharging process, through switching the switches Q1-Q10, a parallel connection of the capacitors C1, C2 and C3 is connected in series to the same single inductor L3. That "the charging inductor and the discharging inductor is one same single inductor L3" means that a charging resonant current IL3 flows through the single inductor L3 during the charging process, whereas, a discharging resonant current IL3 flows through the single inductor L3 during the discharging process; neither the charging resonant current IL3 nor the discharging resonant current IL3 will flow through any other inductor. In one embodiment, the inductor L3 can be a variable inductor.

As shown in FIG. 6, one end of the switch Q5 is coupled to a node between the switch Q1 and the capacitor C1. One end of the switch Q6 is coupled to a node between the switch Q2 and the capacitor C2. One end of the switch Q7 is coupled to a node between the switch Q3 and the capacitor C3. One end of the switch Q8 is coupled to a node between the switch Q2 and the capacitor C1. One end of the switch Q9 is coupled to a node between the switch Q3 and the capacitor C2. One end of the switch Q10 is coupled to a node between the switch Q4 and the capacitor C3. As shown in FIG. 6, the other ends of the switches Q5-Q7 are commonly electrically connected to a node, which is connected to a node between the switch Q4 and the inductor L3. The other ends of the switches Q8-Q10 are commonly coupled to the ground voltage level. The other end of the inductor L3 is coupled to the output voltage Vout. The other end of the switch Q1 is coupled to an input voltage Vin.

The switches Q1-Q10 are controlled by the corresponding switch drivers 603 to switch electrical connections between the corresponding capacitors C1-C3 and the inductor L3 according to the charging operation signal GA and the discharging operation signal GB generated by the controller 601. In the charging process, according to the charging operation signal GA, the switches Q1-Q4 are controlled to be ON, whereas, the switches Q5-Q10 are controlled to be OFF, such that a series connection of the capacitors C1-C3 and the inductor L3 is formed between the input voltage Vin and the output voltage Vout, to form a charging path. In the discharging process, according to the discharging operation signal GB, the switches Q5-Q10 are controlled to be ON, whereas, the switches Q1-Q4 are controlled to be OFF, such that the capacitors C1, C2 and C3 form a parallel connection and the parallel connection is connected in series to the inductor L3, to form plural discharging paths. It is noteworthy that, in one embodiment, the above-mentioned charging process and the above-mentioned discharging process are performed at different periods in a repeated, alternating manner. That is, the above-mentioned charging process and the above-mentioned discharging process are not performed at the same time. The charging process and the discharging process are performed in turn, to convert the input voltage Vin to the output voltage Vout. In this embodiment, the DC bias voltages of the capacitors C1, C2 and C3 all have a level of Vo. Thus, the capacitors C1, C2 and C3 of the present invention will only need to withstand a relatively lower rated voltage. Hence, the present invention can use capacitors having a smaller size.

In the embodiment where the charging inductor and the discharging inductor are implemented as one same single inductor L3, zero current switching (ZCS) which is one form of soft switching can be achieved through properly arranging a ratio of the duration period (Ton1) of the above-mentioned charging process to the duration period (Ton2) of the above-mentioned discharging process. To be more specific, in one embodiment, the duration period of the above-mentioned charging process is set to be substantially equal to for example 25% of the cycle period. The switches can be switched at a time point when the currents flowing through the switches are at a relatively lower level of their respective positive half waves, such that soft switching can be achieved. In one preferred embodiment, zero current switching (ZCS) can be achieved. In one embodiment, the duration period of the above-mentioned charging process is smaller than a specific ratio of cycle period by a predetermined period. For example, the duration period of the above-mentioned charging process is smaller than 25% of the cycle period by a predetermined period. Thus, after the first switches Q1-Q4 have been turned OFF, a little amount of current remains, which flows through the charging inductor L3 to take away accumulated charges stored in a parasitic capacitor of the switch Q10 via the parasitic diode of the first switch Q4, so that the voltage across the first switch Q10 can be reduced, thus achieving soft switching.

In one preferred embodiment, the level of the reference signal is adjustable, so as to adjust the predetermined period, such that zero voltage switching (ZVS) can be achieved.

On the other hand, in one embodiment, the duration period of the above-mentioned discharging process is greater than a specific ratio of cycle period by a predetermined period. For example, the duration period of the above-mentioned discharging process is greater than 75% of the cycle period by a predetermined period. Thus, during the delayed turned-OFF period of the first switches Q5-Q10, a negative current of the discharging inductor L2 will flow through a parasitic diode of the first switch Q5, to charge a parasitic capacitor of the first switch Q1. As a result, the voltage across the first switch Q1 will be reduced, for achieving soft switching. In one preferred embodiment, a level of the reference signal is adjustable, so as to adjust the predetermined period, such that zero voltage switching (ZVS) can be achieved.

In one embodiment, the above-mentioned resonant switching power converter 60 may be a bidirectional resonant switching power converter. In one embodiment, a voltage conversion ratio of the input voltage Vin to the output voltage Vout of the above-mentioned resonant switching power converter 60 can be 4:1, 3:1 or 2:1. In one embodiment, the voltage conversion ratio of the above-mentioned resonant switching power converter 60 is adjustable. For example, in the charging process and in the discharging process, by keeping the switch Q7 to be always ON while keeping the switches Q4 and Q10 to be always OFF, the voltage conversion ratio of the resonant switching power converter 60 can be adjusted to 3:1. For another example, in the charging process and in the discharging process, by keeping the switch Q6 to be always ON while keeping the switches Q9, Q3, Q7, Q4 and Q10 to be always OFF, the voltage conversion ratio of the resonant switching power converter 60 can be adjusted to 2:1.

Figure 7:
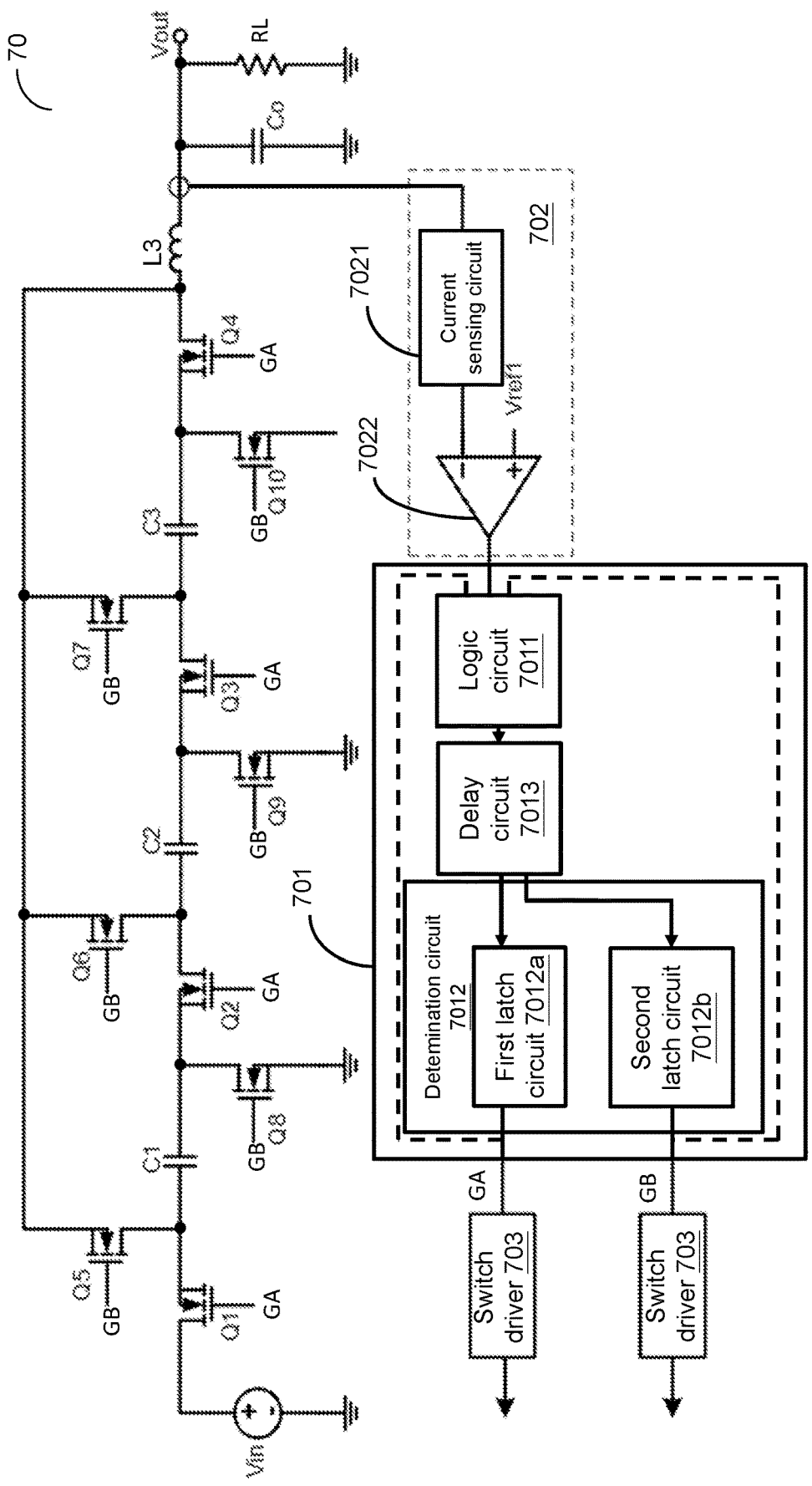
FIG. 7 illustrates a schematic circuit diagram of a resonant switching power converter according to still another embodiment of the present invention.

Please refer to FIG. 7. FIG. 7 illustrates a schematic circuit diagram of a resonant switching power converter 70 according to still another embodiment of the present invention. The configuration and operation mechanism of the controller 701, the logic circuit 7011, the determination circuit 7012, the first latch circuit 7012a, the second latch circuit 7012b, the delay circuit 7013, the zero current detection circuit 702, the current sensing circuit 7021, the comparison circuit 7022 and the switch drivers 703 in FIG. 7 are similar to those in FIG. 4, and the capacitors C1-C3, the switches Q1-Q10 and the inductor L3 in FIG. 7 are similar to those in FIG. 6, so the detailed descriptions thereof are omitted. This embodiment shows an example of applying the controller architecture of FIG. 4 to the resonant switching power converter having one single inductor.

Figure 8A:
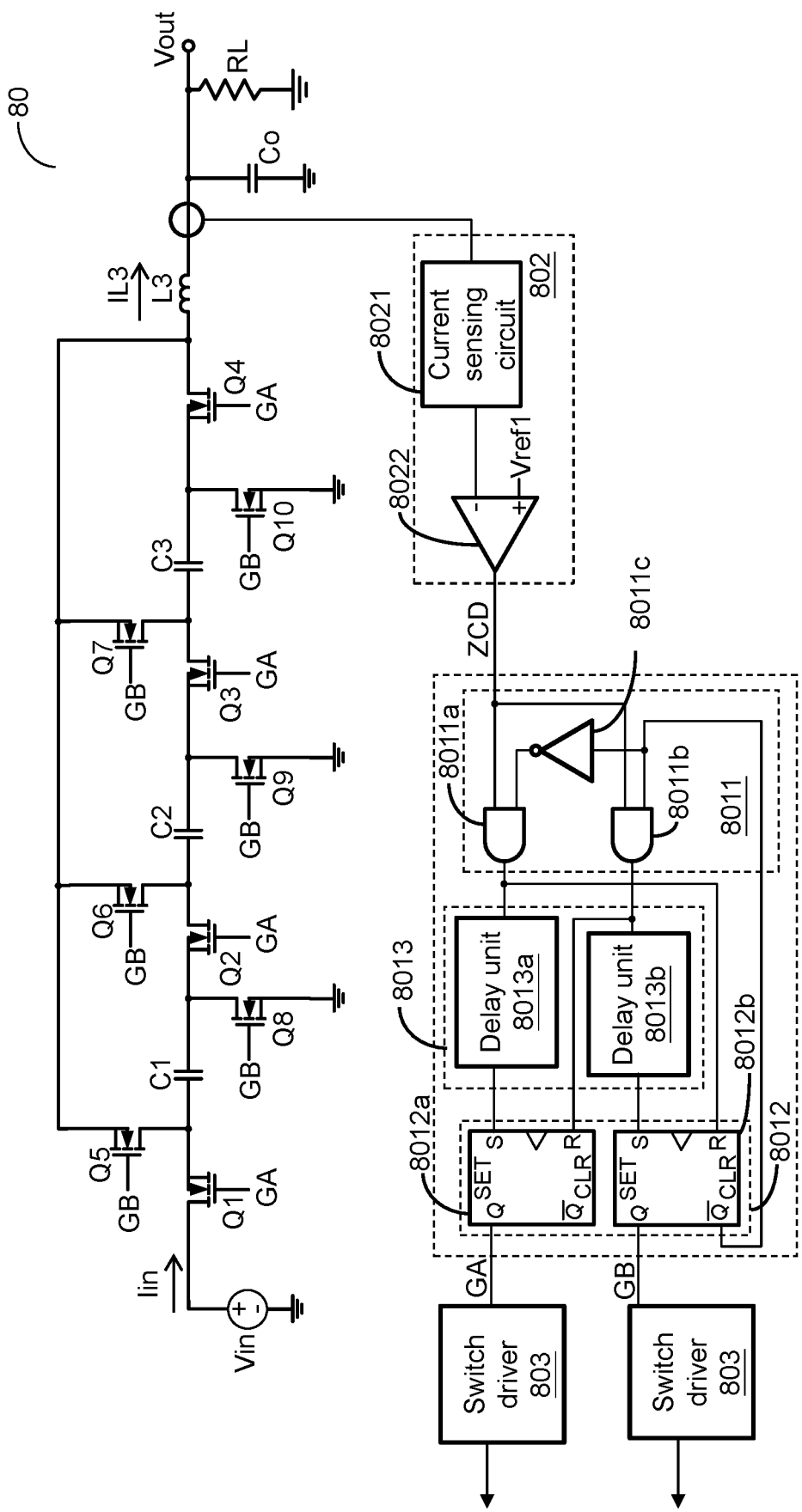
FIG. 8A illustrates a schematic circuit diagram of a resonant switching power converter according to yet another embodiment of the present invention.

Please refer to FIG. 8A. FIG. 8A illustrates a schematic circuit diagram of a resonant switching power converter 80 according to yet another embodiment of the present invention. The capacitors C1-C3, the switches Q1-Q10 and the inductor L3 in FIG. 8A are similar to those in FIG. 6, so the detailed descriptions thereof are omitted. This embodiment shows an example of applying the controller architecture of FIG. 5 to the resonant switching power converter having one single inductor. Moreover, the controller 801 of this embodiment includes a logic circuit 8011, a determination circuit 8012 and a delay circuit 8013. The determination circuit 8012 includes a first latch circuit 8012a and a second latch circuit 8012b. The delay circuit 8013 includes a delay unit 8013a and a delay unit 8013b.

In one embodiment, the delay circuit 8013 may be optional. In this embodiment, the logic circuit 8011 includes a first AND gate 8011a, a second AND gate 8011b and a NOT gate 8011c. The first AND gate 8011a is coupled between the comparison circuit 8022 and the first latch circuit 8012a; the second AND gate 8011b is coupled between the comparison circuit 8022 and the second latch circuit 8012b; the NOT gate 8011c is coupled between the second latch circuit 8012b and the first AND gate 8011a. In the determination circuit 8012, the first latch circuit 8012a is coupled between the first AND gate 8011a and the corresponding switch driver 803, whereas, the second latch circuit 8012b is coupled between the second AND gate 8011b and the corresponding switch driver 803.

One operation method according to the present invention is described as an example with reference to the embodiment shown in FIG. 8A. When the charging process starts, a reset terminal R of the second latch circuit 8012b receives the charging determination signal at high level, so as to reset an output terminal Q of the second latch circuit 8012b, such that the output terminal Q of the second latch circuit 8012b outputs the discharging operation signal GB at low level and the switches Q5-Q10 are thus controlled to be OFF. In the charging process, an output terminal Q of the first latch circuit 8012a outputs a charging operation signal GA at high level, so as to control the switches Q1-Q4 to be ON. An invert phase signal (at high level) of the discharging operation signal GB outputted by an invert phase output terminal Q of the second latch circuit 8012b is inputted into the second AND gate 8011b. The second AND gate 8011b keeps the discharging determination signal at low level until the zero current detection circuit 802 detects that the charging resonant current IL1 drops to zero current and the zero current detection signal ZCD is switched to high level (which indicates that the charging process is completed). The second AND gate 8011b performs AND logic operation on the invert phase signal (at high level) of the discharging operation signal GB outputted by the invert phase output terminal Q and the zero current detection signal ZCD at high level, so as to generate the discharging determination signal at high level, which is sent to the determination circuit 8012. Accordingly, the second latch circuit 8012b generates the discharging operation signal GB at high level at the output terminal Q thereof, which is sent to the switch driver 803, so as to control the switches Q5-Q10 to be ON and start the discharging process. Furthermore, the reset terminal R of the first latch circuit 8012a receives the discharging determination signal at high level and resets the output terminal Q of the first latch circuit 8012a, such that the output terminal Q generates the charging operation signal GA at low level, which is sent to the corresponding switch driver 803. The switches Q1-Q4 are thus controlled to be OFF and the charging process is completed.

On the other hand, when the discharging process starts, a reset terminal R of the first latch circuit 8012a receives the discharging determination signal at high level, so as to reset an output terminal Q of the first latch circuit 8012a, such that the output terminal Q of the first latch circuit 8012a outputs the charging operation signal GA at low level and the switches Q1-Q4 are thus controlled to be OFF. In the discharging process, an output terminal Q of the second latch circuit 8012b outputs a discharging operation signal GB at high level, so as to control the switches Q5-Q10 to be ON. The NOT gate 8011c performs NOT logic operation on the invert phase signal (at low level) of the discharging operation signal GB outputted by an invert phase output terminal Q of the second latch circuit 8012b, so as to generate a logic operation result at high level, which is sent to the first AND gate 8011a. The first AND gate 8011a keeps the charging determination signal at low level until the zero current detection circuit 802 detects that the discharging resonant current IL2 drops to zero current and the zero current detection signal ZCD is switched to high level (which indicates that the discharging process is completed). The first AND gate 8011a performs AND logic operation on the computation result at high level outputted by the NOT gate 8011c and the zero current detection signal ZCD at high level, so as to generate the charging determination signal at high level, which is sent to the determination circuit 8012. Accordingly, the first latch circuit 8012a generates the charging operation signal GA at high level at the output terminal Q thereof, which is sent to the switch driver 803, so as to control the switches Q1-Q4 to be ON and start the charging process. Furthermore, the reset terminal R of the second latch circuit 8012b receives the charging determination signal at high level and resets the output terminal Q of the second latch circuit 8012b, such that the output terminal Q thereof generates the discharging operation signal GB at low level, which is sent to the corresponding switch driver 803. The switches Q5-Q10 are thus controlled to be OFF and the discharging process is completed.

The delay unit 8013*a* is coupled between the first AND gate 8011*a* and a set terminal S of the first latch circuit 8012*a*, wherein the delay unit 8013*a* is configured to operably delay the turned-ON time points of the plural switches Q1-Q4 for a delay interval, wherein in the delay interval all of the corresponding switches Q1-Q4 are OFF, so as to delay the start time points of the charging process for a time period, which is the delay interval. The delay unit 8013*b* is coupled between the second AND gate 8011*b* and a set terminal S of the second latch circuit 8012*b*, wherein the delay unit 8013*b* is configured to operably delay the turned-ON time points of the plural switches Q5-Q10 for a delay interval, wherein in the delay interval all of the corresponding switches Q5-Q10 are OFF, so as to delay the start time points of the discharging process for a time period, which is the delay interval.

Figure 8B:
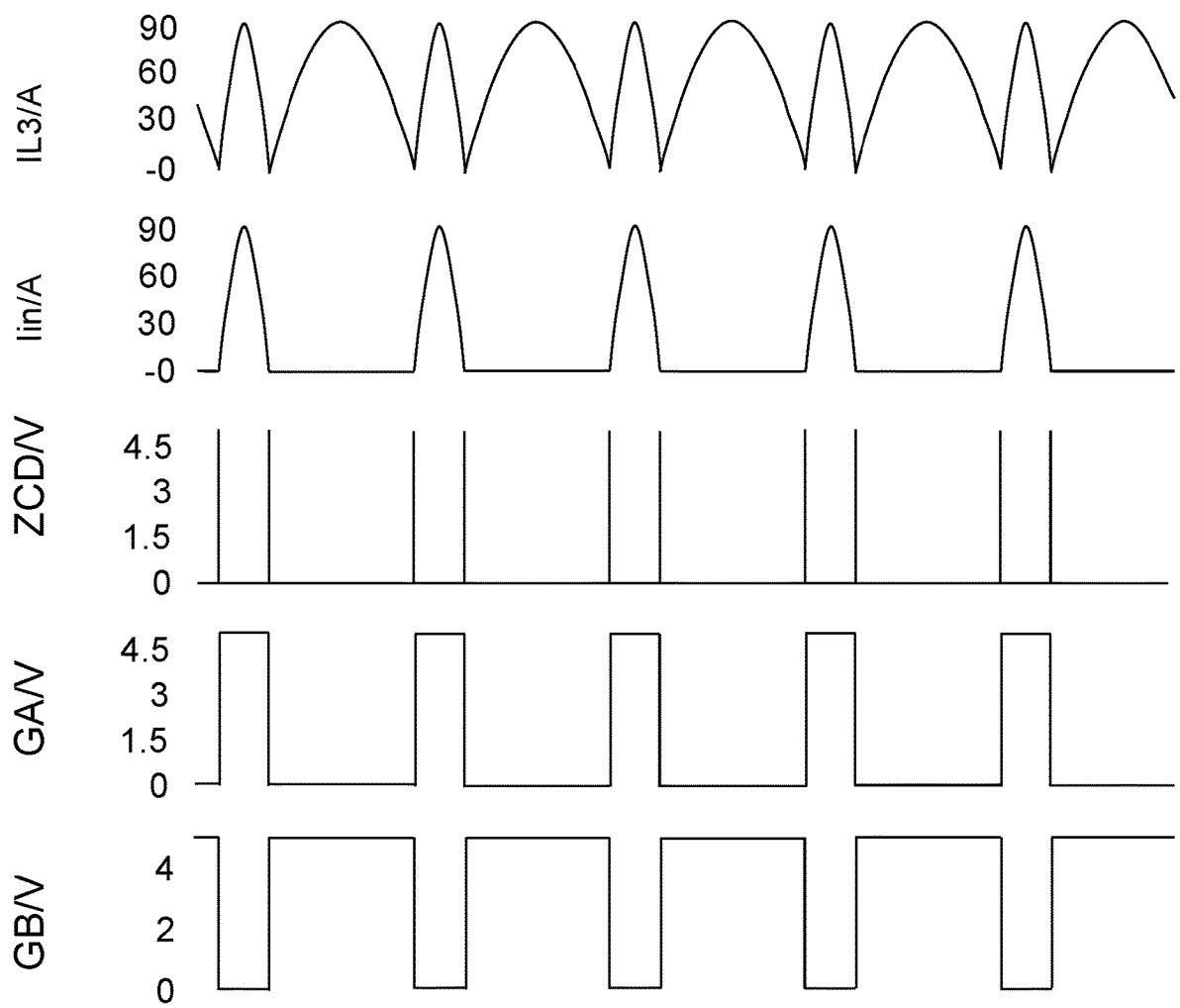
FIG. 8B illustrates waveform diagrams of relevant signals of the circuit of FIG. 8A.

FIG. 8B illustrates waveform diagrams of relevant signals of the resonant switching power converter shown in FIG. 8A without the delay circuit 8013. The waveform diagrams of the charging resonant current/discharging resonant current (also referred to as inductor current) IL3, an inputted current Iin, the zero current detection signal ZCD, the charging operation signal GA and the discharging operation signal GB are as shown in FIG. 8B. In this embodiment, the duration period of the charging process is substantially equal to 25% of the cycle period, and the duration period of the discharging process is substantially equal to 75% of the cycle period. It is noteworthy that the inductor current IL3 sensed in the charging process is the charging resonant current, whereas, the inductor current IL3 sensed in the discharging process is the discharging resonant current. As shown in FIG. 8B, for example, every time when the zero current detection signal ZCD generates a pulse, it will trigger level switchings of the charging operation signal GA and the discharging operation signal GB, to determine the start time points and end time points of the charging process and the discharging process.

Figure 9:
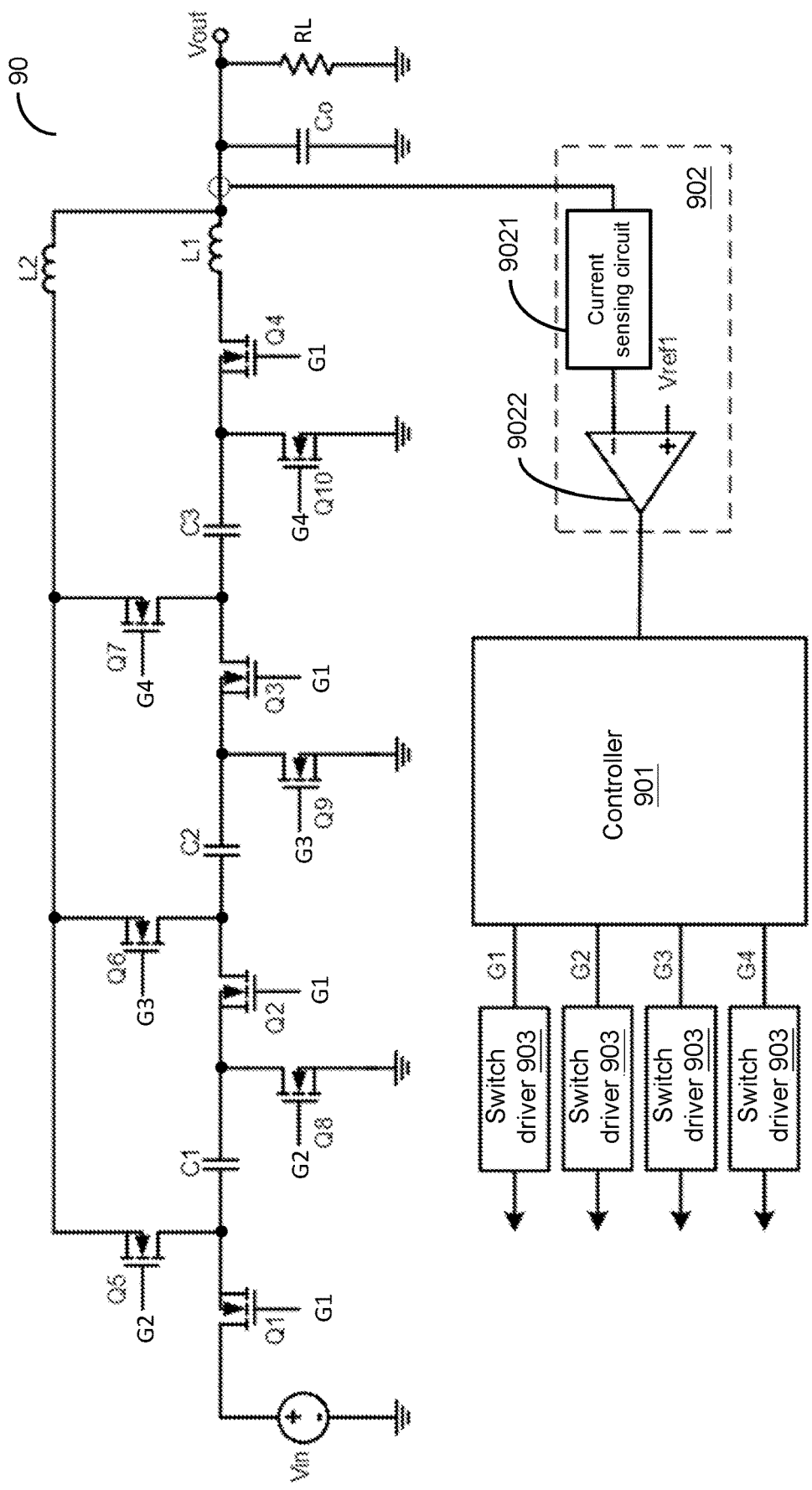
FIG. 9 illustrates a schematic circuit diagram of a resonant switching power converter according to still another embodiment of the present invention.

Please refer to FIG. 9. FIG. 9 illustrates a schematic circuit diagram of a resonant switching power converter 90 according to still another embodiment of the present invention. The configuration and operation mechanism of the controller 901, the zero current detection circuit 902, the current sensing circuit 9021, the comparison circuit 9022, the switch drivers 903, the capacitors C1-C3, the switches Q1-Q10, the charging inductor L1 and the discharging inductor L2 in FIG. 9 are similar to those in FIG. 3A, and the detailed descriptions thereof are therefore omitted. This embodiment is an example showing that the discharging process is divided into plural discharging processes, and the plural discharging processes are respectively performed at different periods in a sequential order. More specifically, the discharging operation signal G2 controls the switches Q5 and Q8 to be ON and controls the switches Q1-Q4, Q6, Q7, Q9 and Q10 to be OFF, so as to discharge the capacitor C1 at a first time period; the discharging operation signal G3 controls the switches Q6 and Q9 to be ON and controls the switches Q1-Q5, Q7, Q8 and Q10 to be OFF, so as to discharge the capacitor C2 at a second time period; the discharging operation signal G4 controls the switches Q7 and Q10 to be ON and controls the switches Q1-Q6 and Q8-Q9 to be OFF, so as to discharge the capacitor C3 at a third time period; the charging operation signal G1 controls the switches Q1-Q4 to be ON and controls the switches Q5-Q10 to be OFF, so as to charge the capacitors C1-C3. It should be appreciated that, in one embodiment, the controller 901 of this embodiment may be replaced with the controller architecture of FIG. 4 or FIG. 5.

Figure 10:
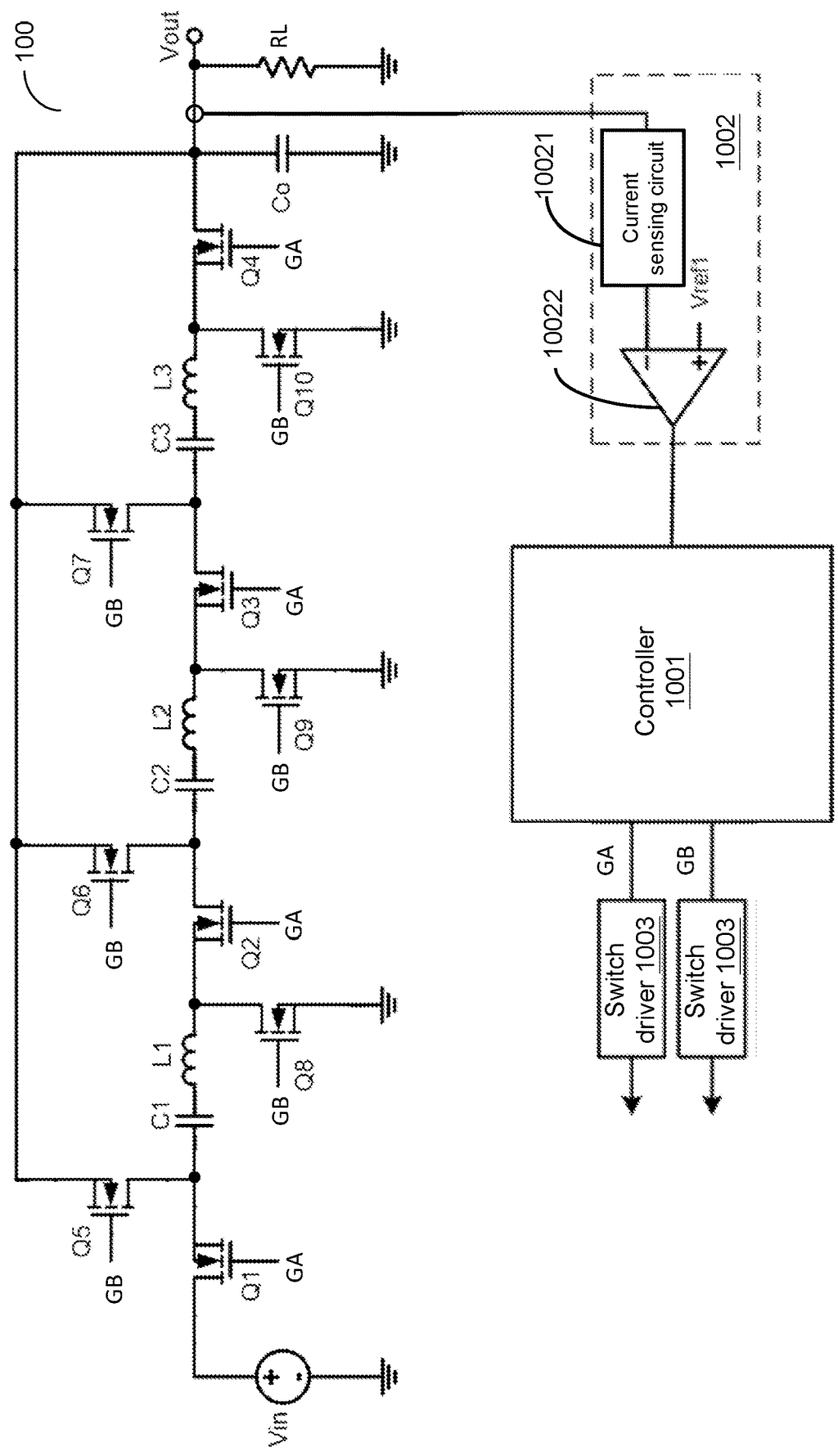
FIG. 10 illustrates a schematic circuit diagram of a resonant switching power converter according to yet another embodiment of the present invention.

Please refer to FIG. 10. FIG. 10 illustrates a schematic circuit diagram of a resonant switching power converter 100 according to yet another embodiment of the present invention. The configuration and operation mechanism of the controller 1001, the zero current detection circuit 1002, the current sensing circuit 10021, the comparison circuit 10022 and the switch drivers 1003 in FIG. 10 are similar to those in. 3A, and the detailed descriptions thereof are therefore omitted. As shown in FIG. 10, the resonant switching power converter 100 of the present invention includes: capacitors C1, C2 and C3, switches Q1, Q2, Q3, Q4, Q5, Q6, Q7, Q8, Q9 and Q10 and inductors L1, L2, L3. The switches Q1, Q2 and Q3 are connected in series to the corresponding capacitors C1, C2 and C3, respectively, whereas, the capacitors C1-C3 are connected in series to the corresponding inductors L1-L3 respectively. Certainly, it should be understood that the implementation of the number of the capacitors of the resonant switching power converter 100 as three in the above-mentioned preferred embodiment is only an illustrative example, but not for limiting the broadest scope of the present invention. In other embodiments, it is also practicable and within the scope of the present invention that the number of the capacitors of the resonant switching power converter 100 can be any plural number other than three. Besides, it should be understood that the implementation of the number of the inductors of the resonant switching power converter 100 as three in the above-mentioned preferred embodiment is only an illustrative example, but not for limiting the broadest scope of the present invention. In other embodiments, it is also practicable and within the scope of the present invention that the number of the inductors of the resonant switching power converter 100 can be a number other than three. It should be understood that the number of the devices in the above-mentioned preferred embodiment, unless emphasized as a feature, is only an illustrative example, but not for limiting the broadest scope of the present invention. It should be appreciated that, in one embodiment, the controller 1001 of this embodiment may be replaced with the controller architecture of FIG. 4 or FIG. 5.

As shown in FIG. 10, one end of the switch Q5 is coupled to a node between the switch Q1 and the capacitor C1. One end of the switch Q6 is coupled to a node between the switch Q2 and the capacitor C2. One end of the switch Q7 is coupled to a node between the switch Q3 and the capacitor C3. One end of the switch Q8 is coupled to a node between the switch Q2 and the inductor L1. One end of the switch Q9 is coupled to a node between the switch Q3 and the inductor L2. One end of the switch Q10 is coupled to a node between the switch Q4 and the inductor L3. As shown in FIG. 10, the other ends of the switches Q5-Q7 are commonly connected to the output voltage Vout. The other ends of the switches Q8-Q10 are commonly coupled to the ground voltage level. The switch Q4 is coupled between the inductor L3 and the output voltage Vout. One end of the switch Q1 is coupled to an input voltage Vin.

The switches Q1-Q10 are controlled by the corresponding switch drivers 1003 to switch electrical connections between the corresponding capacitors C1-C3 and the inductors L1-L3 according to the charging operation signal GA and the discharging operation signal GB generated by the controller 1011. In the charging process, the switches Q1-Q4 are controlled to be ON, whereas, the switches Q5-Q10 are controlled to be OFF, such that a series connection of the capacitors C1-C3 and the inductors L1-L3 is formed between the input voltage Vin and the output voltage Vout, to form a charging path. In the discharging process, the switches Q5-Q10 are controlled to be ON, whereas, the switches Q1-Q4 are controlled to be OFF, such that a series connection of the capacitor C1 and the corresponding inductors L1 is formed between the output voltage Vout and a ground voltage level; a series connection of the capacitor C2 and the corresponding inductors L2 is formed between the output voltage Vout and the ground voltage level; and a series connection of the capacitor C3 and the corresponding inductors L3 is formed between the output voltage Vout and the ground voltage level, to form plural discharging paths. It is noteworthy that, in one embodiment, the above-mentioned charging process and the above-mentioned discharging process are performed at different periods in an alternating manner. That is, the above-mentioned charging process and the above-mentioned discharging process are not performed at the same time. In one embodiment, the charging process and the discharging process are performed in turn, to convert the input voltage Vin to the output voltage Vout. In this embodiment, the DC bias voltages of the capacitors C1, C2 and C3 all have a level of Vo. As a consequence, the capacitors C1, C2 and C3 of the present invention will only need to withstand a relatively lower rated voltage. Hence, the present invention can use capacitors having a smaller size.

In one embodiment, the duration period of the above-mentioned charging process is substantially equal to a specific ratio of cycle period. For example, the duration period of the above-mentioned charging process is substantially equal to, for example but not limited to, 50% of the cycle period. As a result, the switches can be switched at a time point when the current flowing through the switches is at a relatively lower level of its positive half wave, such that soft switching can be achieved. In one embodiment, zero current switching (ZCS) can be achieved.

In one embodiment, the above-mentioned specific ratio is correlated with the resonant frequency. In one embodiment, the above-mentioned charging process has a charging resonant frequency, whereas, the above-mentioned discharging process has a discharging resonant frequency. In one preferred embodiment, the above-mentioned charging resonant frequency is identical to the above-mentioned discharging resonant frequency.

Please refer to FIG. 11A, which illustrates waveform diagrams of operation signals and inductor currents corresponding to a charging process and a discharging process according to one embodiment of the present invention. Please refer to FIG. 3A along with FIG. 11A. In the embodiment shown in FIG. 11A, the charging operation signal GA corresponding to the switches Q1-Q4 is at high level in the charging process, whereas, the discharging operation signal GB corresponding to the switches Q5-Q10 is at high level in the discharging process. In the embodiment shown in FIG. 11A, the duration period of the charging process is substantially equal to 50% of the cycle period. As a result, the switches can be switched at a time point when the current flowing through the switch Q1 are at a relatively lower level of its positive half wave (i.e., the switches can be switched at a time point when the current IL1 flowing through the charging inductor L1 is equal to zero), such that soft switching can be achieved. In one preferred embodiment, zero current switching (ZCS) can be achieved.

Please refer to FIGS. 11B-11C, which illustrate waveform diagrams of operation signals and inductor currents corresponding to a charging process and a discharging process according to another embodiment of the present invention. Please refer to FIG. 3A along with FIG. 11B. In the embodiment shown in FIG. 11B, the charging operation signal GA corresponding to the switches Q1-Q4 is at high level in the charging process, whereas, the discharging operation signal GB corresponding to the switches Q5-Q10 is at high level in the discharging process. In the embodiment shown in FIG. 11B, the reference signal is adjusted to a higher level, such that the duration period of the charging process is smaller than 50% of the cycle period substantially by a predetermined period T1. Thus, after the first switches Q1-Q4 have been turned OFF, a little amount of current remains, which flows through the charging inductor L1 to take away accumulated charges stored in a parasitic capacitor of the switch Q10 via the parasitic diode of the first switch Q4, so that the voltage across the first switch Q10 can be reduced, thus achieving soft switching. In one preferred embodiment, zero voltage switching (ZVS) can be achieved through adjusting the predetermined period T1. Please refer to FIG. 3A along with FIG. 11C. In the embodiment shown in FIG. 11C, the charging operation signal GA corresponding to the switches Q1~Q4 is at high level in the charging process, whereas, the discharging operation signal GB corresponding to the switches Q5-Q10 is at high level in the discharging process. In the embodiment shown in FIG. 11C, the reference signal is adjusted to a lower level, such that the duration period of the discharging process is greater than 50% of the cycle period substantially by a predetermined period T2. Thus, during the delayed turned-OFF period of the first switches Q5-Q10, a negative current of the discharging inductor L2 will flow through a parasitic diode of the first switch Q5, to charge a parasitic capacitor of the first switch Q1. As a result, the voltage across the first switch Q1 will be reduced, for achieving soft switching. In one preferred embodiment, zero voltage switching (ZVS) may be achieved through adjusting the predetermined period T2. It is noteworthy that, in one embodiment, the embodiment of FIG. 11B and the embodiment of FIG. 11C may be implemented alone or in combination.

The present invention provides a resonant switching power converter as described above. Merits of the present invention include: that the present invention can reduce the required inductor number; that the present invention can compensate for component parameter variations due to the DC bias voltage or operating temperature; that the present invention can reduce the switching frequency to enhance the efficiency at light load condition; that the present invention can support output voltage regulation function; that the present invention can lower voltage stress; that all resonant capacitors can have the same rated current and rated voltage so that the present invention can support using capacitors with a smaller size; that the present invention can perform dynamic control to achieve soft-switching with ZCS or ZVS; that the present invention has better dynamic load transient response and better current voltage balance; that the present invention has stable resonant frequency; that the present invention can flexibly adjust the voltage conversion ratio; that the present invention can perform bidirectional operation.

It is noteworthy that the "high level" and "low level" mentioned in the above embodiments are given as an example, not for limiting the scope of the present invention. In other embodiments, the "high level" and "low level" may be interchanged or designed otherwise according to the required logic operations under the same spirit of the present invention.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A resonant switching power converter, which is configured to operably convert an input voltage to an output voltage, the resonant switching power converter comprising:
    a plurality of capacitors;
    a plurality of switches coupled to the plurality of capacitors;
    at least one charging inductor connected in series to at least one of the plurality of capacitors;
    at least one discharging inductor connected in series to at least one of the plurality of capacitors;
    a controller configured to operably generate a charging operation signal corresponding to a charging process and at least one discharging operation signal corresponding to at least one discharging process, so as to operate the plurality of switches, such that the plurality of switches switch electrical connections of the capacitors; and
    at least one zero current detection circuit configured to operably detect a charging resonant current flowing through the at least one charging inductor in a charging process and/or detect at least one discharging resonant current flowing through the at least one discharging inductor in the at least one discharging process, the zero current detection circuit generating at least one zero current detection signal which is sent to the controller when the zero current detection circuit detects that a level of the charging resonant current and/or a level of the at least one discharging resonant current is zero;
    wherein the charging operation signal and the at least one discharging operation signal have respective ON periods which do not overlap with one another, such that the charging process and the at least one discharging process do not overlap with one another;
    wherein in the charging process, the controller is configured to operably control the corresponding switches via the charging operation signal, such that a series connection of the plurality of capacitors and the at least one charging inductor is formed between the input voltage and the output voltage, to form a charging path;
    wherein in the at least one discharging process, the controller is configured to operably control the corresponding switches via the at least one discharging operation signal, such that a series connection of each of the capacitors and the corresponding discharging inductor is formed between the output voltage and a ground voltage level, to form a plurality of discharging paths at the same time or in a sequential order;
    wherein the controller determines start time points and end time points of the charging process and the at least one discharging process according to the at least one zero current detection signal;
    wherein the charging process and the at least one discharging process are arranged in a repeated, alternating manner, so as to convert the input voltage to the output voltage;
    wherein the controller determines the start time points and the end time points of the charging process and the at least one discharging process further according to the charging operation signal and/or the at least one discharging operation signal;
    wherein the controller comprises:
        a logic circuit coupled to the at least one zero current detection circuit, wherein the logic circuit is configured to operably generate a charging determination signal and a discharging determination signal according to the at least one zero current detection signal and the charging operation signal and/or the at least one discharging operation signal; and
        a determination circuit coupled to the logic circuit, wherein the determination circuit is configured to operably generate the charging operation signal and the at least one discharging operation signal according to the charging determination signal and the discharging determination signal, so as to determine the start time points and the end time points of the charging process and the at least one discharging process.

2. The resonant switching power converter of claim 1, wherein the at least one zero current detection circuit comprises: a current sensing circuit, which is configured to operably sense the charging resonant current in the charging processes or sense the at least one discharging resonant current in the at least one discharging process, so as to generate a current sensing signal; and a comparison circuit, which is configured to operably compare the current sensing signal with a reference signal, so as to generate the at least one zero current detection signal.

3. The resonant switching power converter of claim 2, further comprising a plurality of switch drivers, each of which is coupled between the controller and the corresponding switch, wherein each of the plural switch drivers is configured to operably control the corresponding switch according to the corresponding charging operation signal or the corresponding discharging operation signal.

4. The resonant switching power converter of claim 1, wherein the controller further comprises a delay circuit coupled between the logic circuit and the determination circuit, wherein the delay circuit is configured to operably delay the start time point of the charging process and/or the start time point of the at least one discharging process for a delay interval.

5. The resonant switching power converter of claim 1, wherein the charging determination signal is employed to determine the start time point of the charging process and the end time point of the at least one discharging process.

6. The resonant switching power converter of claim 5, wherein the logic circuit performs AND logic operation on the at least one zero current detection signal and an invert phase signal of the charging operation signal, so as to generate the charging determination signal.

7. The resonant switching power converter of claim 6, wherein the determination circuit includes a first latch circuit, wherein the first latch circuit is configured to operably set the charging operation signal according to the charging determination signal and switch a level of the charging operation signal according to the discharging determination signal, and the first latch circuit is configured to operably generate an invert phase signal of the charging operation signal which is inputted into the logic circuit.

8. The resonant switching power converter of claim 1, wherein the discharging determination signal is employed to determine the start time point of the at least one discharging process and the end time point of the charging process.

9. The resonant switching power converter of claim 8, wherein the logic circuit performs AND logic operation on the at least one zero current detection signal and an invert phase signal of the at least one discharging operation signal, so as to generate the discharging determination signal.

10. The resonant switching power converter of claim 9, wherein the determination circuit comprises a second latch circuit, wherein the second latch circuit is configured to operably set the at least one discharging operation signal according to the discharging determination signal and switch a level of the at least one discharging operation signal according to the charging determination signal, and the second latch circuit is configured to operably generate an invert phase signal of the at least one discharging operation signal which is inputted into the logic circuit.

11. The resonant switching power converter of claim 1, wherein the at least one charging inductor is one single charging inductor, and the at least one discharging inductor is one single discharging inductor.

12. The resonant switching power converter of claim 11, wherein an inductance of the single charging inductor is equal to an inductance of the single discharging inductor.

13. The resonant switching power converter of claim 1, wherein the at least one charging inductor and the at least one discharging inductor is one same single inductor.

14. The resonant switching power converter of claim 13, wherein the same single inductor is a variable inductor.

15. The resonant switching power converter of claim 1, wherein the charging process has a charging resonant frequency, whereas, the at least one discharging process has a discharging resonant frequency, and wherein the charging resonant frequency is identical to the discharging resonant frequency.

16. The resonant switching power converter of claim 1, wherein the charging process has a charging resonant frequency, whereas, the at least one discharging process has a discharging resonant frequency, and wherein the charging resonant frequency is different from the discharging resonant frequency.

17. The resonant switching power converter of claim 2, wherein a level of the reference signal is adjustable to adjust a duration period of the charging process, such that zero voltage switching is achieved.

18. The resonant switching power converter of claim 2, wherein a level of the reference signal is adjustable to adjust a duration period of the at least one discharging process, such that zero voltage switching is achieved.

19. The resonant switching power converter of claim 1, wherein the resonant switching power converter is a bidirectional resonant switching power converter.

20. The resonant switching power converter of claim 1, wherein a voltage conversion ratio of the input voltage to the output voltage of the resonant switching power converter is 4:1, 3:1 or 2:1.

21. The resonant switching power converter of claim 1, wherein the at least one zero current detection signal is generated when the at least one zero current detection circuit detects that the level of the charging resonant current is zero, wherein at an end of a delay interval starting from a time point at which the at least one zero current detection signal is generated, the discharging operation signal is switched to perform the at least one discharging process.

22. The resonant switching power converter of claim 1, wherein the at least one zero current detection signal is generated when the at least one zero current detection circuit detects that the level of the discharging resonant current is zero, wherein at an end of a delay interval starting from a time point at which the at least one zero current detection signal is generated, the charging operation signal is switched to perform the charging process.

\* \* \* \* \*